(12) United States Patent
Tuozzolo et al.

(10) Patent No.: US 8,299,767 B1
(45) Date of Patent: Oct. 30, 2012

(54) DYNAMIC SAFE OPERATING AREA CONTROL

(75) Inventors: Claudio Tuozzolo, Johnston, RI (US);
Aiman Alhoussami, Lincoln, RI (US);
John P. Clarkin, Coventry, RI (US);
Robert M. Lanoue, East Greenwich, RI (US); Andreas Gerasimos Ladas, Kingston, RI (US)

(73) Assignee: Picor Corporation, North Smithfield, RI (US)

( * ) Notice: Subject to any disclaimer, the term of this patent is extended or adjusted under 35 U.S.C. 154(b) by 330 days.

(21) Appl. No.: 12/776,634

(22) Filed: May 10, 2010

Related U.S. Application Data

(63) Continuation-in-part of application No. 11/893,984, filed on Aug. 17, 2007, now abandoned.

(60) Provisional application No. 60/838,914, filed on Aug. 18, 2006.

(51) Int. Cl.
*H02H 5/04* (2006.01)
*H02H 3/08* (2006.01)

(52) U.S. Cl. .......... 323/277; 323/275; 323/279; 361/79; 361/93.8; 361/103

(58) Field of Classification Search .......... 323/265, 323/273, 274, 275, 276, 277, 279, 284, 285, 323/289, 907; 361/79, 93.8, 93.9, 103; 363/50; 702/132, 136
See application file for complete search history.

(56) References Cited

U.S. PATENT DOCUMENTS

| | | | |
|---|---|---|---|
| 4,937,697 A | 6/1990 | Edwards et al. .......... 361/18 |
| 5,282,107 A | 1/1994 | Balakrishnan | |
| 5,444,590 A | 8/1995 | LeComte et al. .......... 361/18 |
| 5,497,072 A | 3/1996 | LeComte et al. .......... 323/289 |
| 5,723,915 A | 3/1998 | Maher et al. | |
| 6,052,268 A | 4/2000 | Thomas | |
| 6,169,439 B1 | 1/2001 | Teggatz et al. | |
| 6,637,930 B2 | 10/2003 | Butchers et al. | |
| 6,898,092 B2 | 5/2005 | Briere et al. | |
| 6,931,345 B1 | 8/2005 | Kim et al. .......... 702/117 |
| 6,987,655 B2 | 1/2006 | Kesler et al. | |
| 7,443,229 B1 | 10/2008 | Vinciarelli et al. | |
| 7,839,201 B2 * | 11/2010 | Jacobson .......... 327/513 |
| 2003/0067955 A1 | 4/2003 | Butchers et al. | |

OTHER PUBLICATIONS

Dumas, et al. "Active Analog Power Filters Provide Solutions for EMC & EMI," *IEEE*, 2004, 6 pages.

Lanoue, Active EMI power filter and hot swap functions merge, *CompactPCI and AdvancedTCA Systems*, Sep. 2005, 3 pages.

Patoka, "Hotswap Design using TPS2490/91 and MOSFET Transient Thermal Response," Texas Instrument Application Report, Jul. 2004, 11 pages.

National Semiconductor Corporation, "LM5069 Positive High Voltage Hot Swap/Inrush Current Controller with Power Limiting", pp. 1-22, Sep. 2006.

* cited by examiner

*Primary Examiner* — Gary L Laxton
(74) *Attorney, Agent, or Firm* — Fish & Richardson P.C.

(57) ABSTRACT

In some implementations, a method of dynamically maintaining a device's operation within a safe operating area (SOA) may include sensing instantaneous voltage and current of the device; determining, based on the sensed instantaneous voltage and current, a value that represents a power dissipated in the device; using the determined dissipated power and a model of thermal behavior of the device to model a junction temperature of the device; and controlling operation of the device based on the modeled junction temperature. A programmable SOA circuit including sensing, scaling, filtering, and controlling functions may be packaged on a single die or in a package with a power transistor.

86 Claims, 25 Drawing Sheets

FET Voltage (Vds)   FIG. 15A

FET Current (Id)   FIG. 15B

FET Power   FIG. 15C

Vload   FIG. 15D

Junction Temp Rise   FIG. 15E

Adaptive Threshold

DYNAMIC SAFE OPERATING AREA CONTROL

CROSS-REFERENCE TO RELATED APPLICATIONS

This application is a continuation-in-part of and claims priority to U.S. patent application Ser. No. 11/893,984, filed on Aug. 17, 2007 now abandoned, which claims priority to U.S. Provisional Application Serial Number 60/838,914, filed Aug. 18, 2006. The entire contents of the above applications are herein incorporated by reference.

BACKGROUND

Electronic components and switches of various kinds (e.g., transistors, or more particularly, FETS) can be used to control or switch power. For example, in some implementations, a transistor may be used as an electronic switch to connect or disconnect power to a load. In other implementations, an electronic component or transistor can be used to more precisely control filter, amplify, manage, or switch power that is delivered to a circuit or load, for example by controlling the current that is allowed to flow through the electronic component.

In general, electronic switches can be designed and rated to conduct specified ranges of current, operate within specified ranges of voltage, or operate within specified temperature ranges. In some implementations, maximum currents or voltages are specified at levels that prevent breakdown of the electronic switch. In particular, voltage can be specified at a level that prevents breakdown of the switch, and current can be specified at a level that prevents damage to the electronic switch (e.g., within a corresponding range of operating temperatures). Operation within specified current, voltage and temperature ranges may be referred to as a safe operating area (SOA).

SUMMARY

This document describes apparatus, systems and methods for automatically and dynamically maintaining a device within a safe operating area (SOA). In some implementations, such apparatus, systems and methods allow designers to more fully utilize an actual SOA of a device. That is, designers may, in some implementations, be able to specify smaller devices for a given application and rely more on actively controlling a device and less on calculated, design-time margins.

In some implementations, a method of dynamically maintaining a device's operation within an SOA may include sensing instantaneous voltage and current of the device; determining, based on the sensed instantaneous voltage and current, a value that represents a power dissipated in the device; using the determined dissipated power and a model of thermal behavior of the device to model a junction temperature of the device; and controlling operation of the device based on the modeled junction temperature.

In general, one aspect features a method of dynamically maintaining operation of a power transistor within a safe operating area. The method may include employing the power transistor to control delivery of electrical power from a power source to a load, detecting a differential signal and controlling operation of the power transistor to produce variations in resistance of the power transistor to offset the differential signal, sensing an instantaneous current through the power transistor and an instantaneous voltage across the power transistor, and based on the instantaneous current and instantaneous voltage, determining a net accumulated thermal energy in the power transistor. When the determined net accumulated thermal energy exceeds a threshold, at least one of the instantaneous current or the instantaneous voltage may be reduced to prevent further accumulation of thermal energy in the power transistor.

Implementations of the method may include one or more of the following features. Determining the net accumulated thermal energy may include generating a signal representative of instantaneous power dissipated by the power transistor, and providing the generated signal to a capacitor and resistor network. Determining the accumulated thermal energy may further include measuring a voltage of the capacitor and resistor network.

In general, another aspect features a method of dynamically maintaining operation of a transistor within a safe operating area. The method may include employing the transistor to control delivery of electrical power from a power source to a load, detecting a differential signal and controlling operation of the transistor to produce variations in resistance of the transistor to offset the differential signal, sensing an instantaneous current through the transistor and an instantaneous voltage across the transistor, generating a representation of thermal energy being added to the transistor from the circuit based on the sensed instantaneous current and sensed instantaneous voltage, generating a representation of a thermal response of the transistor to the representation of thermal energy dissipated in the transistor, and when the representation of the thermal response of the transistor meets predetermined criteria, controlling at least one of the current through the transistor or the voltage across the transistor.

Implementations of the method may include one or more of the following features. The representation of thermal energy may include a signal representative of instantaneous power dissipated in the transistor, and generating a representation of a thermal response may include providing the generated signal to a capacitor and resistor network. The representation of a thermal response may include a voltage at a terminal of the capacitor and resistor network.

In general, another aspect features a method that includes extracting thermal characteristics of a transistor, providing a system having characteristics based upon the derived thermal characteristics of the transistor, using the transistor in a circuit, detecting a differential signal and controlling operation of the transistor to produce variations in resistance of the transistor to offset the differential signal, determining a current carried by the transistor and a voltage across the transistor, stimulating the system using information produced from the determined current or voltage, and controlling operation of the transistor as a function of a response by the system to the stimulation.

Implementations of the method may include one or more of the following features. The stimulating may further include using information produced from the determined current and voltage. The determining may include sensing at least one voltage and at least one current in the circuit. The stimulating may include feeding a current representative of the product of multiplying the determined voltage and sensed current. The system can be a network that includes at least one resistor and at least one capacitor. The thermal characteristics may include one or more time constants in a transient thermal impedance of the transistor and one or more thermal resistances between a power dissipating portion of the transistor and a package, heatsink, or environment in which the transistor is to be located during operation. Using the transistor may include controlling the delivery of power between a source and a significantly capacitive load. The response by the system may represent a relative junction temperature. The method may further include sensing a temperature of the environment to which the transistor is coupled during operation, and the response by the system represents an absolute junction temperature.

In general, another aspect features a method that includes providing transistor for use in a circuit, detecting a differential signal and controlling operation of the transistor to produce variations in resistance of the transistor to offset the differential signal, sensing the voltage and current stresses on the transistor during operation in the circuit, modeling instantaneous temperature conditions in the transistor, and controlling operation of the transistor as a function of the instantaneous temperature conditions.

Implementations of the method may include one of more of the following features. The temperature conditions may include a rise in temperature in the transistor. The temperature conditions may include a junction temperature in the transistor. Modeling instantaneous temperature conditions may include producing a power signal representative of instantaneous power dissipation in the transistor. Modeling instantaneous temperature conditions may further include producing an energy signal representing energy accumulating in the transistor. The energy signal may further represent energy dissipating out of the transistor. The modeling may include modeling thermal characteristics of the transistor and emulating a thermal response of the transistor to the voltage and current stresses. Modeling thermal characteristics of the transistor may further include characterizing a thermal time constant of the transistor. The method can be carried out using digital calculations. The method can be carried out using analog circuitry. Modeling thermal characteristics of the transistor may further include characterizing a thermal impedance between a region of the transistor and a physical interface. The interface can include a heat sink. The interface can include a gaseous environment. The controlling may further include limiting the current through the transistor. The controlling may further include the current limit up or down to regulate the temperature of a region of the transistor. The region of the transistor may include a semiconductor junction. The controlling may include turning the transistor OFF for a period of OFF-time. The controlling may further include limiting the current. The period of OFF-time may include a first duration during a start-up mode and a second longer duration during a steady state mode. The period of OFF-time can be adaptively controlled as a function of operating conditions. The controlling may include turning the transistor ON for a period of time. The controlling may further include limiting the current. The controlling may include causing the transistor to intermittently operate beyond steady state safe operating conditions. The method may further include deriving thermal characteristics of the transistor.

In general, another aspect features a method that includes enclosing circuitry for carrying out the method described above together with the transistor in a single device package.

In general, another aspect features a method of dynamically maintaining operation of a power transistor within a safe operating area. The method may include sensing input signals including an instantaneous current through the power transistor and an instantaneous voltage across the power transistor. A first signal may be generated based on the instantaneous current and instantaneous voltage sensing. The first signal may be filtered to produce a second signal. The filtering may have a response that includes the characteristics of at least one zero and at least one pole. At least one of the instantaneous current through the power transistor or the instantaneous voltage across the power transistor may be controlled in response to the second signal from the filtering.

Implementations of the method may include one or more of the following features. The controlling may include reducing at least one of the instantaneous current through the power transistor or the instantaneous voltage across the power transistor in response to the second signal exceeding a high threshold. The reducing may include turning the power transistor OFF. The high threshold may be adjusted in response to the reducing. The high threshold may be reduced after a predetermined number cycles of reducing. The controlling may include increasing at least one of the instantaneous current through the power transistor or the instantaneous voltage across the power transistor in response to the second signal falling below a low threshold. The increasing may include turning the power transistor ON. The low threshold may be adjusted in response to the reducing. The low threshold may be reduced after a predetermined number cycles of reducing. The first signal may be representative of instantaneous power dissipated in the power transistor. The generating may include multiplying a value representing the sensed voltage and a value representing the sensed current to produce a product representative of instantaneous power dissipated in the power transistor. The first signal may be increased to a value greater than a value representative of instantaneous power dissipated in the power transistor. The filtering may include feeding the first signal to a plurality of parallel filters, and accumulating the outputs of the plurality of filters to produce the second signal. The plurality of filters may include a first filter having a response based upon junction-to-case thermal characteristics of the power transistor. The junction-to-case thermal characteristics may include one or more time constants in a transient thermal impedance of the power transistor and one or more thermal resistances between a power dissipating portion of the transistor and a case of the power transistor. The plurality of filters may include a second filter having a response based upon case-to-ambient thermal characteristics of the power transistor. The case-to-ambient thermal characteristics may have one or more time constants in a transient thermal impedance of the power transistor case and one or more thermal resistances between the power transistor case and a heatsink or environment in which the transistor is to be located during operation. The filtering may include using a digital filter. At least one of the sensing, generating, and filtering may include converting an analog signal to a digital signal. The filter may be programmed with at least one parameter for adjusting the filter response. The programming may include sensing a signal in a circuit. The programming may be hardwired in the filter. The filtering may include using an analog filter. The first signal may be a current and the filtering may include feeding the first signal to a capacitor and resistor network. The second signal may be a voltage from the capacitor and resistor network. An SOA circuit may be provided to perform the generating and filtering. The SOA circuit may also perform the controlling. The SOA circuit may be provided on a single die. The SOA circuit and the power transistor may be provided in a unitary package. The unitary package may be a chip scale system in a package. The controlling may include turning the power transistor OFF for a period of OFF-time. The reducing may include limiting the current. The period of OFF-time may include a first duration during a start-up mode and a second longer duration during a steady state mode. The period of OFF-time may be adaptively controlled as a function of operating conditions. The controlling may include turning the power transistor ON for a period of time. The controlling may include limiting the current. The controlling may include causing the power transistor to intermittently operate beyond steady state safe operating conditions. A differential signal may be detected and the power transistor may be controlled to produce variations in resistance to offset the differential signal. At least one of the sensed input signals may be multiplied by a scaling factor. A scaling input signal may be received to determine the scaling factor. An SOA circuit may be provided to perform the multiplying, generating, and filtering. An SOA circuit may be provided to perform the multiplying, generating, filtering and controlling. The SOA circuit may be provided on a single die. A power transistor may be employed to control delivery of electrical power from a power source to a load and the SOA circuit and power transistor may be provided in a unitary package. The time constant of the zero may be set in the range of five to ten times smaller than the time constant of the pole. A power transistor may be employed to control delivery of electrical power from a power source to a load.

The details of one or more implementations are set forth in the accompanying drawings and the description below. Other features, objects, and advantages will be apparent from the description and drawings, and from the claims.

DESCRIPTION OF DRAWINGS

FIGS. 15A-F are plots illustrating various operational aspects of the digital controller depicted in FIG. 14.

Like reference symbols in the various drawings indicate like elements.

DETAILED DESCRIPTION

A safe operating area (SOA) for an electronic switch can be specified in different ways. For example, one datasheet for Fairchild Semiconductor's FDC3601N device specifies a maximum drain-source voltage of 100 V, a maximum continuous drain current of 1.0 A, and a maximum power dissipation of 0.96 W—when the device is soldered to a printed circuit board (PCB) having copper pads of a specified weight and specified dimensions. Drain current can be increased to 4.0 A under certain conditions (e.g., a pulse width of less than 100 μs). For details of the conditions under which drain current can be increased, the datasheet includes various specification curves (e.g., drain-voltage curves, a peak transient power-time curve, and transient thermal resistance-time curves). Three such curves are reproduced as FIGS. 1-3.

Figure 1:
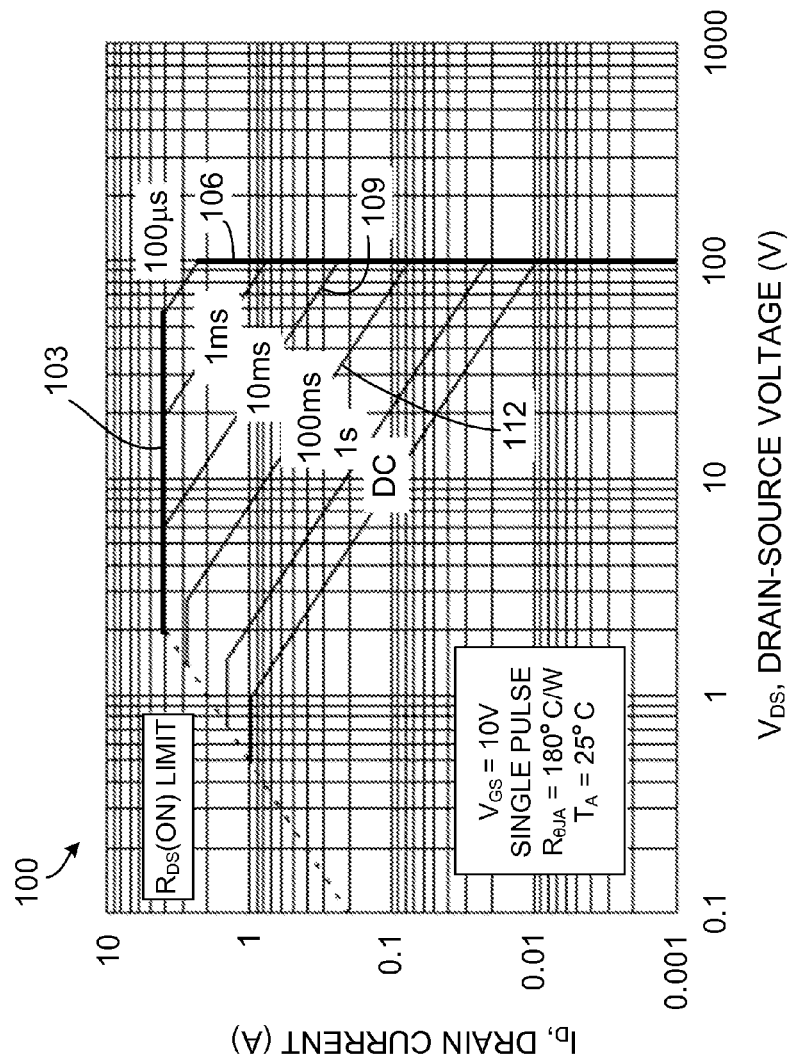
FIG. 1 is an example current-voltage plot that a designer can use to determine a safe operating area (SOA) of an electronic switch.

FIG. 1 illustrates an example set of current-voltage curves 100 for the example FDC3601N device mentioned above. As shown in FIG. 1, the maximum drain current limit (4 A) is depicted by a line 103, and the maximum drain-source voltage (100 V) is depicted by a line 106. Within the area bounded by the lines 103 and 106 are various constant power lines corresponding to particular time durations that provide an upper boundary for an SOA. For example, a line 109 indicates that the device can handle 100 V, at about 0.23 A, for 10 ms; the same line at a different point indicates that the device can handle about 3 A at 8 V for the same 10 ms. A line 112 characterizes the device's current and voltage handling capabilities for 100 ms pulses. In particular, the line 112 indicates that the device can handle about 0.07 A at 100 V for 100 ms; the same line at a different point indicates that the device can handle about 2 A at 3.5 V for 100 ms. A designer can use the various voltage-current curves shown in FIG. 1 to determine (e.g., through direct inspection, or by interpolation) whether the corresponding device will work in a particular application, given a fixed ambient temperature. Other curves may also be useful in this determination, such as the curves reproduced as FIGS. 2 and 3

Figure 2:
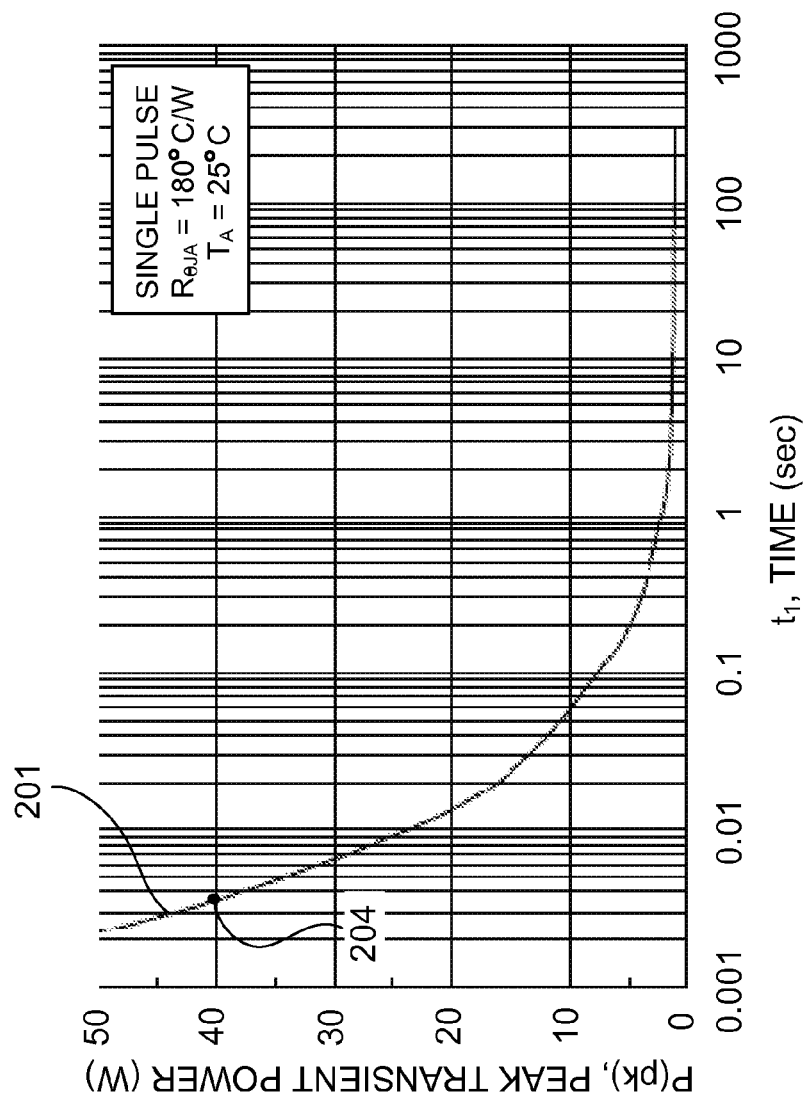
FIG. 2 is an example peak power-time plot that a designer can use to determine an SOA of an electronic switch.

FIG. 2 shows an example peak power-time plot for a device. The curve 201 characterizes the amount of power for a given time that the device can dissipate (e.g., within a specified absolute maximum drain current and drain-source voltage). In particular, for example, the curve 201, at point 204, indicates that the device can dissipate a 40 W pulse of power, if the pulse is about 0.0033 seconds or shorter, given a fixed ambient temperature.

Figure 3:
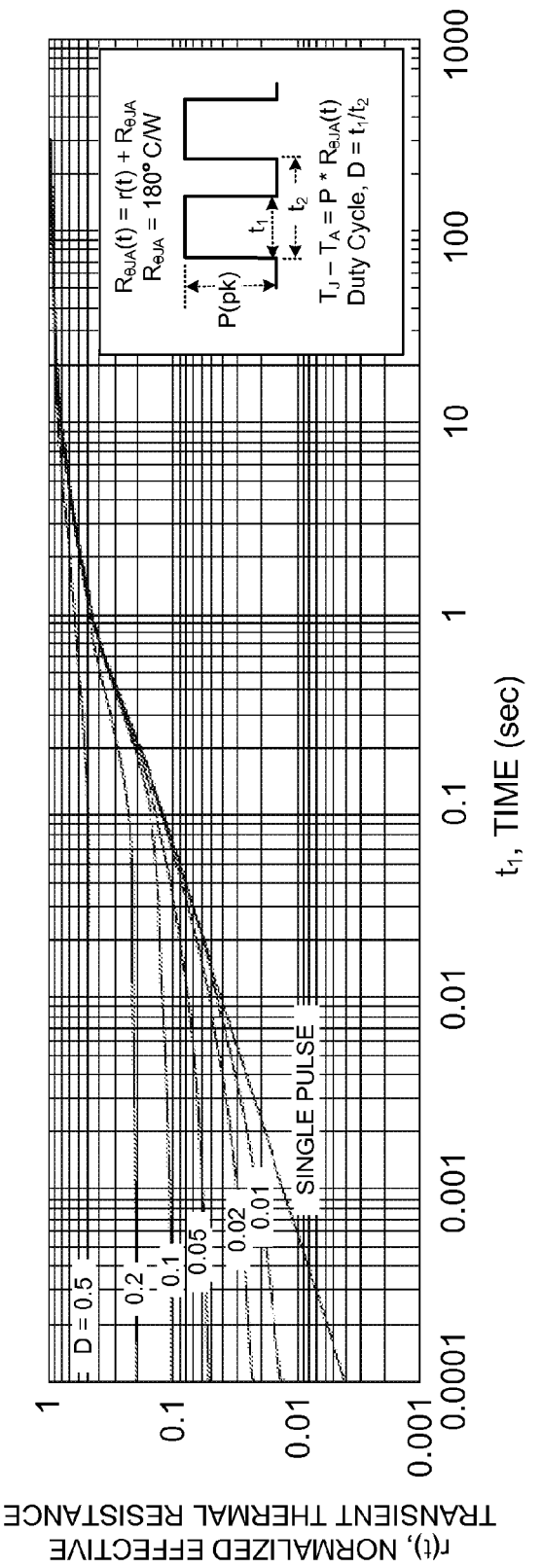
FIG. 3 is an example transient thermal resistance plot that a designer can use to determine an SOA of an electronic switch.

A transient thermal response curve can be useful to designers in determining an SOA in an environment in which the ambient temperature is not fixed at a specified temperature or where the device is subjected to multiple pulses. FIG. 3 shows a set of normalized effective transient thermal resistance curves. Manufacturers may publish two such curves: one for junction-to-case thermal resistance and one for junction-toair thermal resistance. These curves can be normalized to their respective steady state thermal resistances; that is the Y-axis scale is at unity when the transient thermal resistance is equal to the steady state thermal resistance. (Unnormalizing the Y-axis would yield a Y scale with units of ° C./Watt.) As shown, the X-axis is in units of time (sec). The curves shown in FIG. 3 provide information on the device's junction temperature rise given the power dissipated (Watts) and the time duration from the curve.

FIG. 3 provides similar information about the device as FIGS. 1 and 2; however, FIG. 3 is not constrained to a fixed ambient temperature, as is the case with FIG. 1, and FIG. 3 also provides information for multiple-pulse scenarios, whereas FIG. 2 is most useful in single-pulse scenarios. In some implementations, FIG. 3 can facilitate a more direct determination of the SOA operation of a device, in order to, for example, achieve a desired junction temperature rise tailored to ensure device reliability. More particularly, using FIG. 3, a designer can select a specific temperature rise he or she needs based on the operating ambient temperature of the PCB and equipment. Given that many real environments operate within a range of ambient temperatures (often high ambient temperatures, in the range of 70° C. to over 100° C.), FIG. 3 can be particularly useful to designers.

Some applications require switching of capacitive loads into a circuit that is already powered up such as hot plug-in of circuit boards or subsystems into a live circuit or backplane. The load capacitance on the circuit board can draw high inrush currents upon insertion into a live backplane. While the capacitance on-board the inserted circuit board is charging, the power device is subjected to high instantaneous power. Inrush currents can be disruptive, causing line sags and glitches. Reliable operation needs to be maintained under fault conditions such as a continuous over load or short. Such inrush currents can be prevented by using a current limiting control circuit. However, excessive power dissipated in the power device can cause elevated junction temperatures and eventually destroy the device. Typically, designers de-rate the power device ratings to ensure operation of the device within an SOA during all foreseeable conditions such as during start-up or hot plug-in conditions to prevent destruction of the device. This design-time de-rating approach typically requires use of larger more expensive components than might otherwise be necessary.

In spite of the utility of various device datasheet figures in enabling a designer to determine, at design time, whether operation of a particular device in a particular circuit will be maintained within an SOA for the device, it can be advantageous to dynamically monitor and control a device during operation to maintain it within an SOA that reflects the device's transient power handling and thermal capabilities.

Figure 4A:
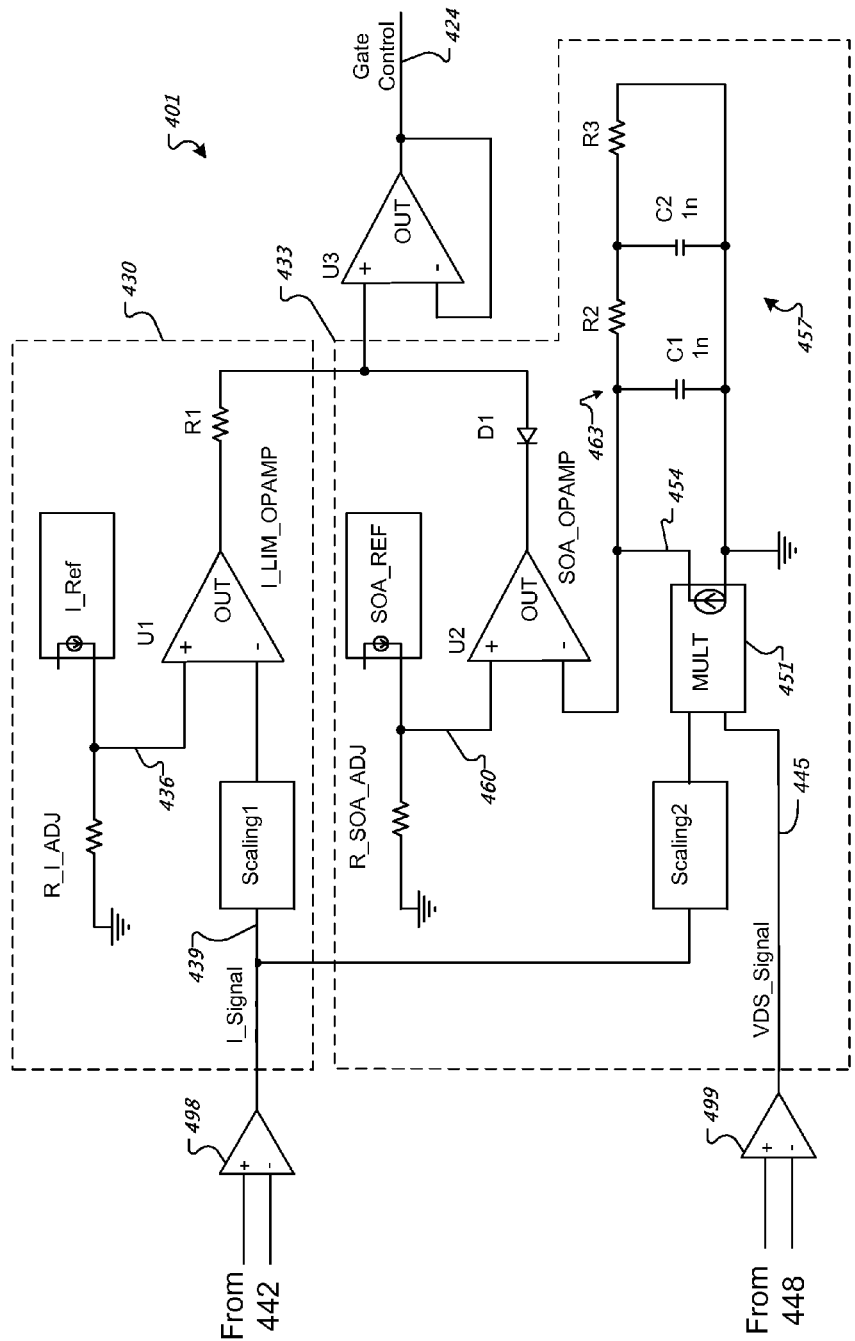
FIG. 4A is a block diagram of a circuit that can be used to limit overall current through an electronic switch and maintain the electronic switch within an SOA.
Figure 4B:
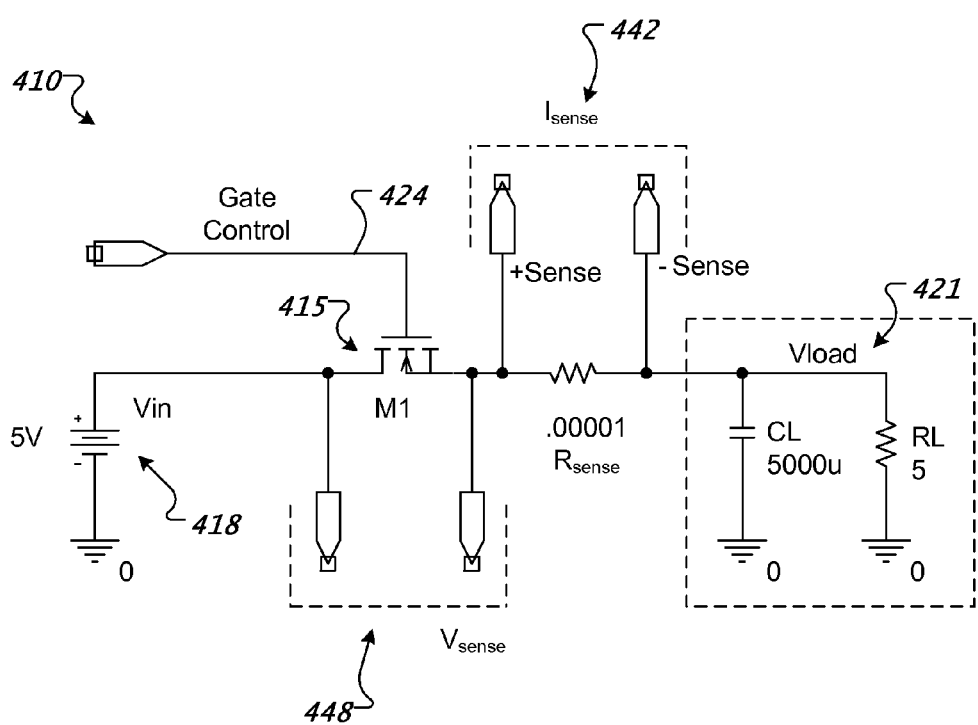
FIG. 4B is an example configuration of an electronic switch whose current can be controlled by the circuit shown in FIG. 4A.

FIG. 4A is a block diagram of a circuit 401 for monitoring current and voltage associated with a MOSFET and dynamically maintaining the MOSFET within an appropriate SOA. For context, FIG. 4B illustrates an example circuit 410 that employs a MOSFET 415 to selectively couple a load 421 (resistance and capacitance in parallel) to power supply 418. The high capacitance component of load 421 may be used to simulate conditions during "hot" plug-in operations. In FIG. 4B, a gate control signal 424 (e.g., a gate control voltage) can be provided to the gate of the MOSFET 415 to control the flow of current from the power supply 418 to the load 421. In some implementations, the gate control signal 424 is provided by the circuit depicted in FIG. 4A.

Turning to FIG. 4A, a circuit 401 for providing a gate control signal 424 for the MOSFET 415 can include a current control loop 430, and an SOA control loop 433. As shown in one implementation, the current control loop 430 can employ a reference signal 436 and a current signal 439 that represents current passing through the MOSFET 415. As shown, current signal 439 can be provided by an amplifier 498 having inputs connected to a current sensing device, such as a low-resistance sense resistor 442 (shown in FIG. 4B). As appropriate, the current signal 439 can be scaled and compared to the reference signal 436. If the current signal 439 (scaled as necessary) exceeds the reference signal (i.e., indicating that the drain current through the MOSFET 415 exceeds a maximum drain current value), the gate control signal 424 can be adjusted to reduce the current flowing through the MOSFET 415 (e.g., to a fixed value).

The SOA control loop 433 can control the gate control signal 424 based on both the current signal 439 and a voltage signal 445 (e.g., a signal that represents drain-source voltage of the MOSFET 415) (e.g., from the drain-source voltage sense circuit/tap 448 and amplifier 499). By multiplying the current signal 439 by the voltage signal 445 (e.g., with a multiplier 451), a power signal 454 can be generated, which can represent an instantaneous power dissipated in the MOSFET 415. The power signal 454 can be fed into a network 457 that can scale and average the power signal 454.

In some implementations, the network 457 is configured to emulate or model thermal characteristics of the MOSFET 415. For example, capacitor C1 can represent a thermal capacitance associated with the junction, and R2 can represent a junction-to-case thermal resistance; similarly, capacitor C2 can represent a case or case/sink thermal capacitance, and R3 can represent a case-to-air or case/sink-to-air thermal resistance. By applying the power signal 454 to the network 457, the resulting voltage value at a node 463 can represent the instantaneous or present relative or absolute junction temperature. A relative junction temperature or junction temperature rise can include, for example, the temperature difference between the junction and the case, heatsink, or ambient environmental temperatures. Alternatively, the absolute junction temperature may represent the actual junction temperature. The circuit block 433 shown in FIG. 4A is arranged to model the time-varying relative junction temperature, which in the case of FIG. 4A is the time-varying difference in temperature between the junction and ambient temperatures, $T_{J-A}$ (herein called the "junction temperature rise"). This modeled junction temperature can be compared to another reference signal 460, which can be selected to represent a maximum permitted junction temperature. The comparison of the reference signal 460 and the power signal 454 can then be used to adjust the gate control signal 424.

The way in which the network 457 can model junction temperature is now described in more detail. As power is dissipated in the MOSFET 415, as represented by the signal 454, the value (e.g., voltage) at the node 463 (e.g., a model of junction temperature) depends on the initial junction temperature (e.g., the voltage on C1), and on how fast the heat can be carried away from the junction (e.g., the current through R2). The rate of heat removal from the junction may in turn depend on the corresponding case or case/heatsink temperature (e.g., the voltage on C2) and the rate of heat removal from the case/heatsink (e.g., the current through R3) which may also depend upon the temperature of the environment. If the junction temperature is currently low, or if the thermal resistance between junction and case is quite low, the device may be able to dissipate more power than if the junction and the case are already quite hot, or the junction-case thermal resistance is relatively high. Thus, the network 457 can model the thermal characteristics of the MOSFET 415, in a manner that facilitates dynamic determination of an SOA for the MOS- FET, based on previous (e.g., recent) power dissipation and thermal characteristics of the MOSFET 415.

The network 457 is shown with two capacitors C1 and C2 and two resistors R2 and R3, but in other implementations, the network 457 can be constructed with any number of resistive and capacitive components to best represent the thermal path that removes heat from the MOSFET junction. Alternatively, the network 457 can be implemented digitally, as described in one implementation with reference to FIG. 14. Moreover, other methods or circuits can be used to integrate instantaneous power dissipation to calculate a time-varying value representative of the absolute or relative temperature in the device or system.

Figure 5:
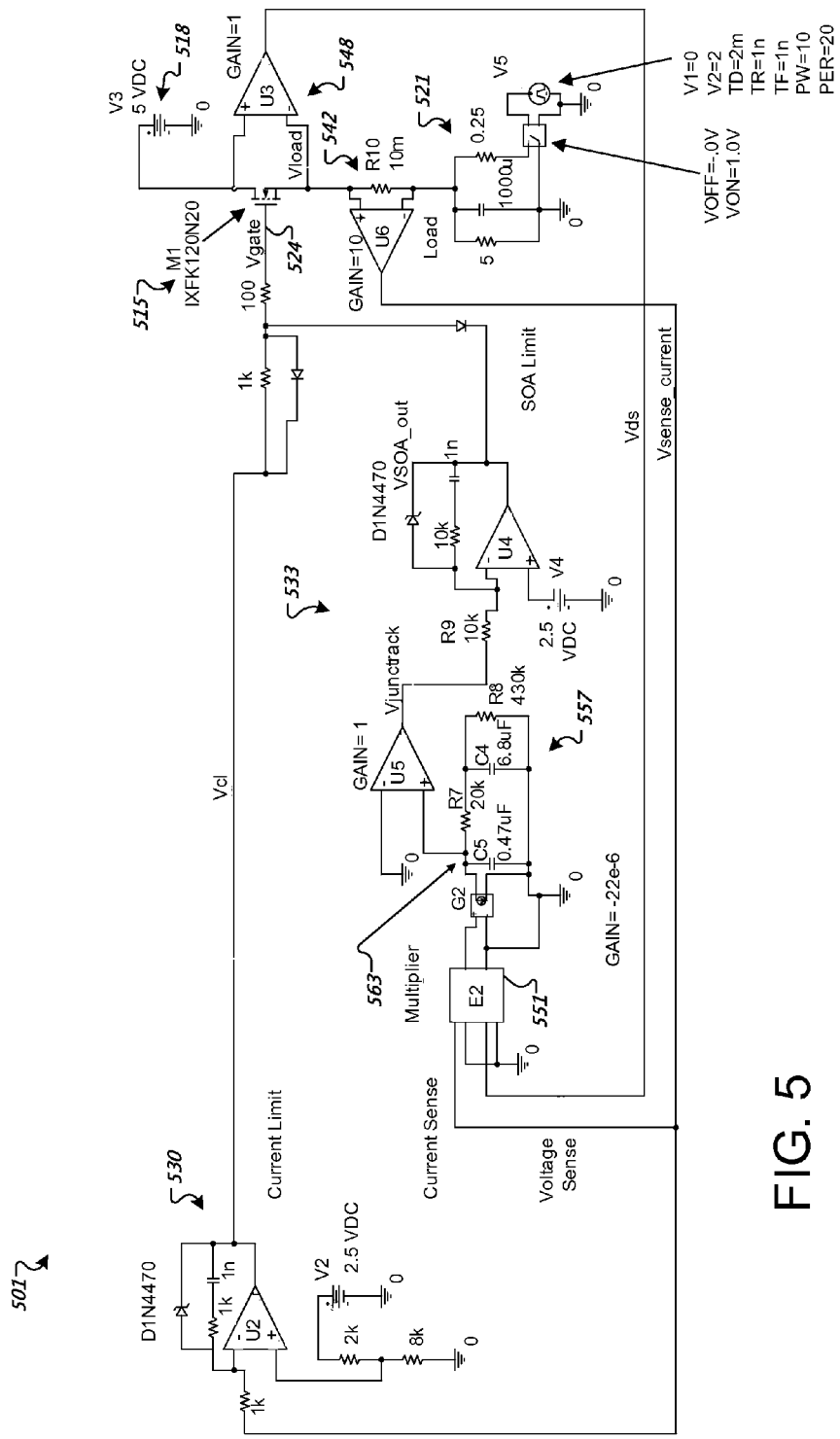
FIG. 5 is an example circuit that corresponds to the block diagram shown in FIG. 4.

FIG. 5 is an example schematic representation of a circuit 501 that implements the circuits 401 and 410 depicted in FIGS. 4A-4B. As shown, the circuit 501 includes a power supply 518, an example load 521 and a MOSFET 515 that can couple the power supply to the load. The example load 521 is highly capacitive and is configured to be able to simulate a fault condition. A gate control signal 524 is provided to control the MOSFET 515, and the gate control signal 524 is modulated by a current control circuit 530 and an SOA control circuit 533. For purposes of illustration, plots of various simulated parameters of the circuit 501 are provided in FIGS. 6A-6E, and the circuit 501 is further explained with reference to the simulation plots.

Figure 6A:
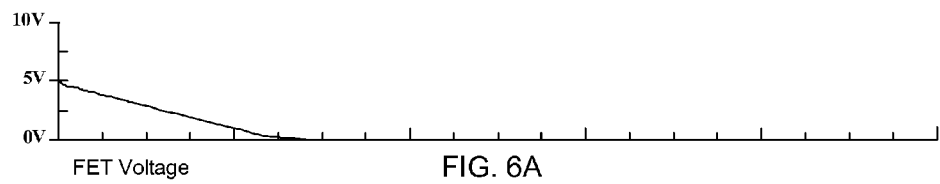
FIGS. 6A-6E are plots illustrating various aspects of operation of the circuit shown in FIG. 5.
Figure 6B:
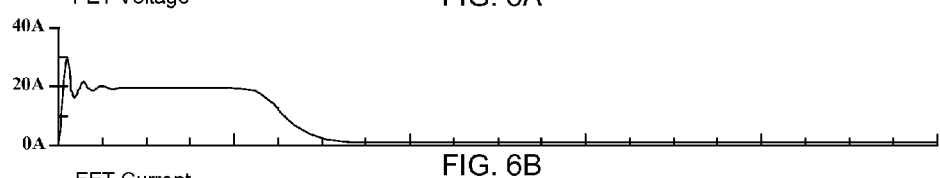
Figure 6C:
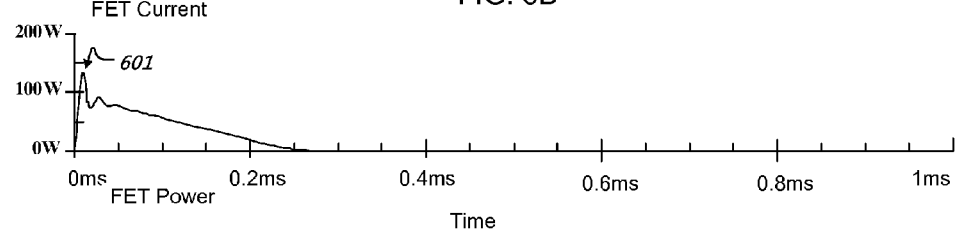
Figure 6D:
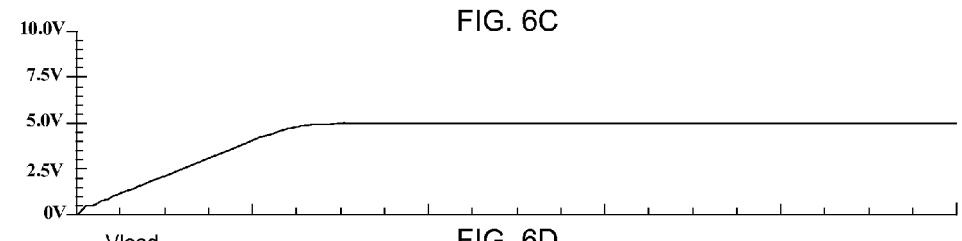

FIG. 6B depicts simulated current through the MOSFET 515 once the MOSFET 515 is turned on. Because of the capacitive nature of the load 521, there is an initial inrush of current from the power supply 518 into the load 521, to charge the load 521. The current control circuit 530 adjusts the gate control signal 524 in order to limit the inrush current during the initial charging phase. FIG. 6B illustrates the effect of the current limiting control provided by the current control circuit 530. In particular, the inrush current, in the example shown, settles out to 20 Amps during the charging phase.

The charging phase lasts for about 200 μs, at which point the current decreases (i.e., since the capacitive load 521 is charged at that point). During this time, the drain-source voltage across the MOSFET 515 decreases, as depicted in FIG. 6A, and the load 521 is charged, as depicted by the load voltage in FIG. 6D. Power dissipated by the MOSFET 515 (e.g., related to the product of the drain-source voltage shown in FIG. 6A and the drain current shown in FIG. 6B) initially surges (peaking at point 601 in FIG. 6C) as the current control circuit 530 responds to limit detected inrush current, then decreases as the load 521 is charged by a controlled, relatively constant current (FIG. 6B).

Figure 6E:
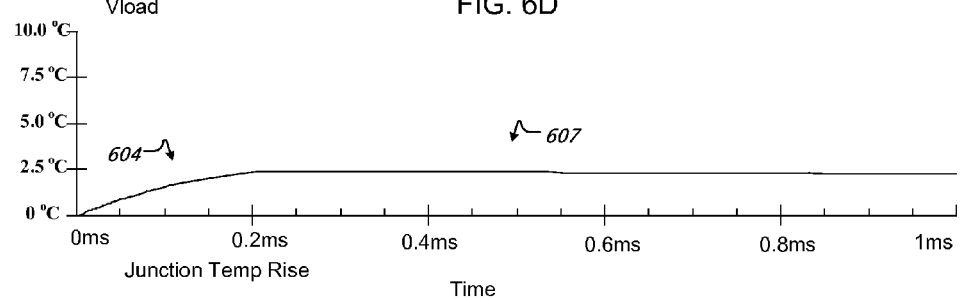

The relative junction temperature ($T_{J-A}$) is depicted in FIG. 6E and is related to the power dissipated (FIG. 6C) and the thermal characteristics of the MOSFET 515. That is, the initial surge in power dissipation at point 601 (FIG. 6C) does not immediately cause a corresponding rise in junction temperature; rather, thermal characteristics of the MOSFET 515 (e.g., thermal capacitance of the junction) cause some delay in the thermal response during a heating phase 604. Similarly, after the current and power dissipation decrease (e.g., at about t=300 μs), the relative junction temperature does not immediately decrease; rather, thermal characteristics of the MOSFET 515 (e.g., thermal resistance between the junction and case or case/sink and thermal capacitance of the case or case/sink) cause another (possibly different) delay in the thermal response during a cooling phase 607.

Note that the actual thermal response of a device can be very device-specific and may be different than the thermal response of the MOSFET 515 that is depicted in FIG. 6E. For example, a device with a lower junction thermal capacitance may heat up faster during the heating phase 604; similarly, a device with a lower case or case/sink capacitance or a lower thermal resistance between the junction and case or case/sink may cool faster during the cooling phase 607. Furthermore, the system in the example provided was set up with the assumption that the junction temperature $T_J$ is equal to the ambient temperature $T_A$ at time t=0. The reader will appreciate that alternative assumptions about the initial junction temperature or other initial conditions may be incorporated into the system.

Returning to FIG. 5, the circuit 501 can include a network 557 of capacitors and resistors that can model the thermal characteristics of the MOSFET 515. In particular, for example, the network can be driven by a signal that represents the instantaneous power dissipation in the MOSFET 515 (e.g., an appropriately scaled product of instantaneous current, provided by a current sense circuit 542, and instantaneous voltage, provided by a drain-source voltage sense circuit 548). The voltage at node 563 resulting from the power-representing signal driving the network 557 can model the junction temperature of the MOSFET 515. Accuracy of the modeling can depend on how well the network components and values model individual thermal characteristics of the MOSFET 515. As described with reference to FIG. 4, different components in the network 557 can represent different thermal parameters. In particular, for example, the capacitor C5 can represent a thermal junction capacitance, the resistor R7 can represent a thermal resistance between the junction and case or case/sink, the capacitor C4 can represent a thermal capacitance of the case or case/sink combination, and the resistance R8 can represent a thermal resistance between the case or case/sink and air (or the environment surrounding the case or case/sink combination). Other components can be added to the network 557 to model the thermal characteristics of the MOSFET 515. For example, another capacitor and resistor can be added to separately model the case and a bolt-on heatsink; another capacitor and resistor could be added to separately model one or more component leads and copper PCB pads to which the leads are soldered.

The configuration of the various network components 557 can represent various thermal paths through which heat may flow from the junction of the MOSFET 515 to the environment. For example, a capacitor may model a thermal mass along, and a resistor may model a thermal resistance in, the path. Although the network 557 of FIG. 5 is shown as a second order model of the junction-to-ambient thermal path of a particular transistor, the reader will understand that additional thermal paths and their associated thermal masses and resistances may be represented in more accurate higher order models if desired.

In general, through appropriate selection of components and values in the network 557, a voltage on the network that results from a signal being applied to the network that represents power dissipated in a corresponding device can be used to model junction temperature of the corresponding device. This voltage can be used by a control circuit that adjusts the power dissipation of the device (e.g., by controlling the current flowing though the device or the voltage across the device or both) in order to dynamically maintain the junction temperature of the device within a safe operating area.

In some implementations, by employing a circuit that dynamically models junction temperature and controls the device based on the modeled junction temperature, designers can specify smaller MOSFET devices than may be otherwise possible. That is, the dynamic modeling and controlling may enable designers to more completely utilize the full capability of the device, reducing the need to de-rate the component and capitalizing on the dynamic SOA features of the component. Moreover, the resulting design may be more flexible in that it may be able to handle a wider range of current and voltage parameters than may be otherwise possible.

In the example depicted in FIGS. 6A-6E, the junction temperature does not substantially increase (nor does the voltage at node 563, which models the junction temperature, substantially increase). Accordingly, the SOA control circuit 533 does not actively limit current through the MOSFET 515 in this example. Another example is described with reference to FIGS. 8A-8E in which the SOA control circuit 533 plays an active role in limiting current through the MOSFET 515 (e.g., in order to limit corresponding power dissipation and maintain the junction temperature within a safe operating area). The example depicted in FIGS. 7A-7E provide contextual background for FIGS. 8A-8E.

Figure 7A:
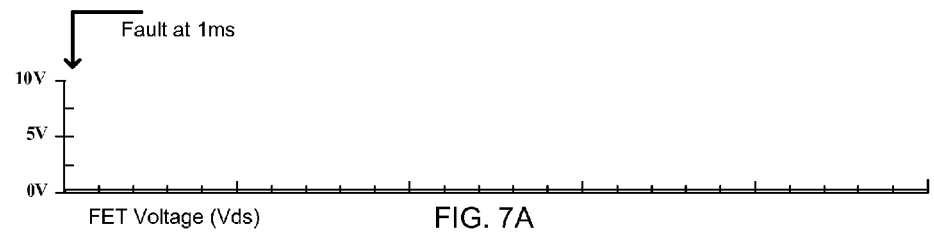
FIGS. 7A-7E are plots illustrating various aspects of a portion of the circuit shown in FIG. 5 with SOA control disabled, during a fault condition.
Figure 7B:
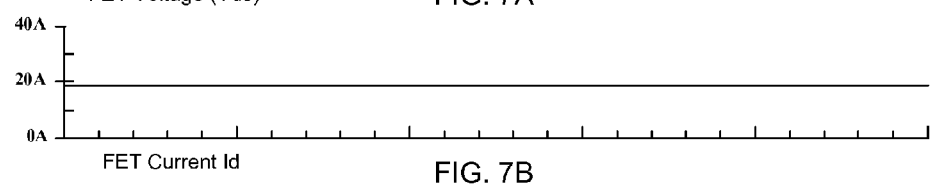
Figure 7C:
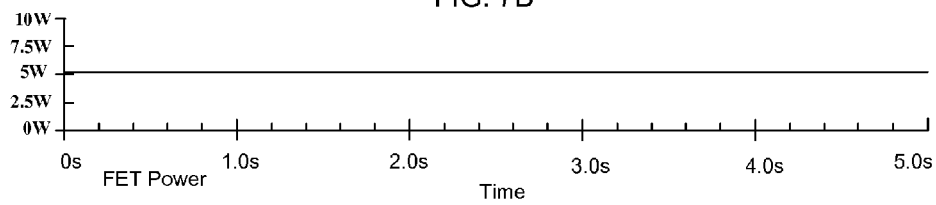
Figure 7D:
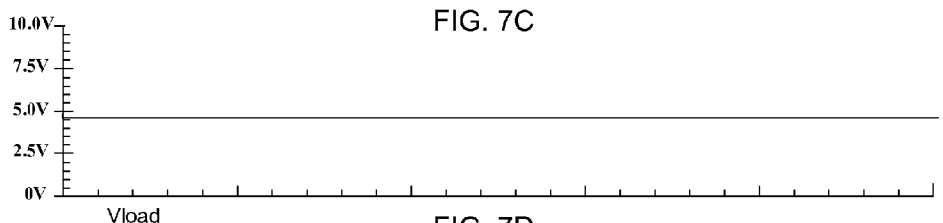
Figure 7E:
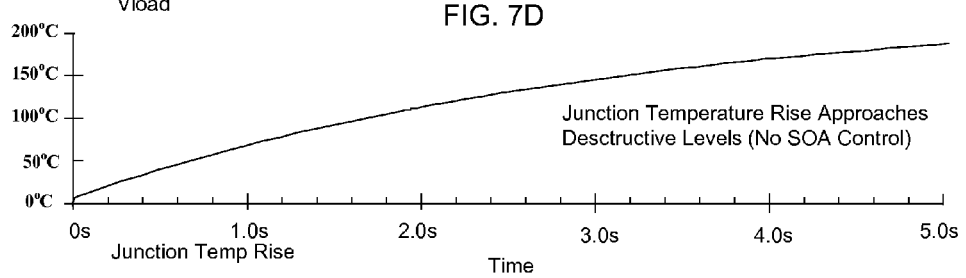

FIGS. 7A-7E depict an example scenario in which a fault condition is simulated at 1 ms. That is, with reference to FIG. 5, the load is shorted through the resistor R2, resulting in high current flow through the MOSFET 515. In the example depicted in FIGS. 7A-7E, the SOA control circuit 533 is not enabled; only the current control circuit 530 is active. However, in this example, the load resistance is high enough that the current draw is slightly below the 20 A set point illustrated in and described with reference to FIG. 6B. That is, given the load resistance in this example, the current control circuit 530 will not limit current through the MOSFET 515, since it is not greater than a maximum current value for the MOSFET 515. As a result, the current through the MOSFET 515 remains steady at just below 20 A, as depicted in FIG. 7B. At the same time, the drain-source voltage, power dissipation, and load voltage remain steady, as depicted in FIGS. 7A, 7C and 7D, respectively. Note, however, that the junction temperature, as depicted in FIG. 7E, continues to rise (e.g., because of too much power consumption relative to the thermal characteristics of the device). The uncontrolled temperature rise depicted in FIG. 7E can lead to the destruction of the MOSFET 515.

Figure 8A:
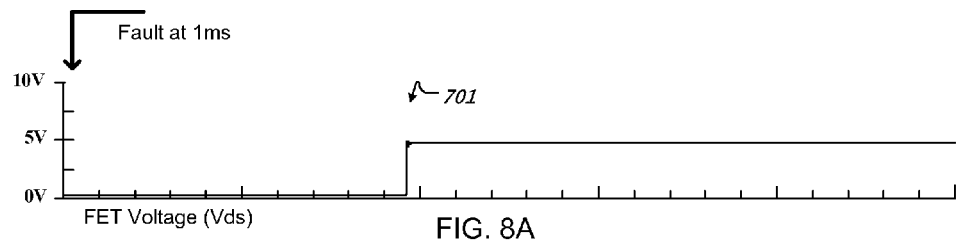
FIGS. 8A-8E are plots illustrating various aspects of the full circuit shown in FIG. 5, during a fault condition.
Figure 8B:
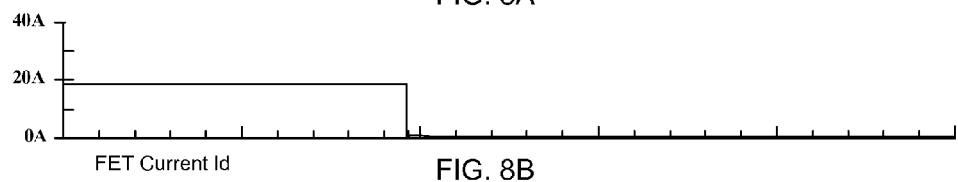
Figure 8C:
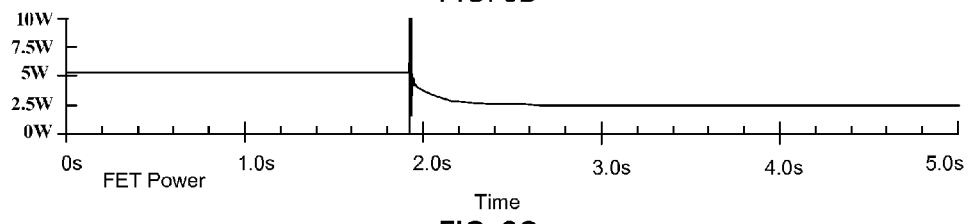
Figure 8D:
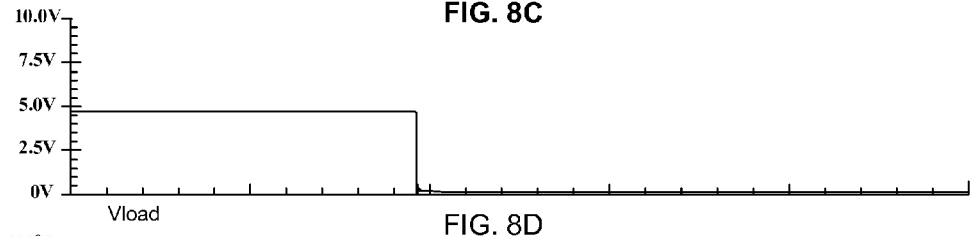
Figure 8E:
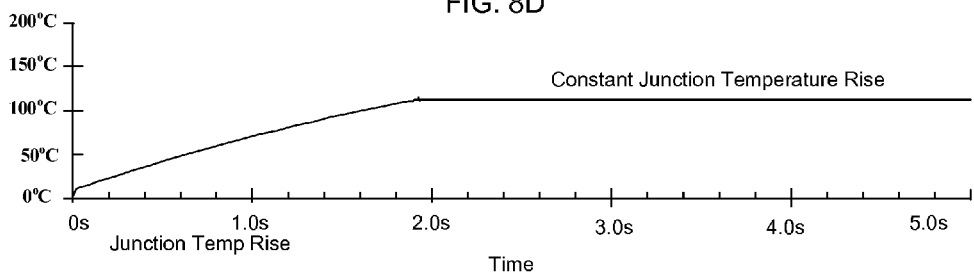

In the example of FIGS. 7A-7E, the SOA control circuit 533 was disabled. FIGS. 8A-8E depict a similar example as that depicted in FIGS. 7A-7E, but with the SOA control circuit 533 enabled. In particular, FIGS. 8A-8E depict an example scenario in which a fault condition is again simulated at 1 ms. As a result, a constant current of just below 20 A is drawn through the MOSFET 515, until a point 701 (i.e., at about 1.9 s), as depicted by FIG. 8B. During the initial time, the drain-source voltage, power dissipation, and load voltage remain steady, as depicted in FIGS. 8A, 8C and 8D, respectively. In addition, the junction temperature rises during this time, as depicted in FIG. 8E.

At the point 701, the current through the MOSFET 515 is limited (e.g., by the SOA control circuit 533, as described below). That is, the drain current drops considerably, as shown in FIG. 8B. Correspondingly, the drain-source voltage increases (FIG. 8A), the power dissipated decreases (FIG. 8C), the load voltage decreases (FIG. 8D), and the junction temperature levels out (FIG. 8E).

The behavior depicted by FIGS. 8A-8E following point 701 can be explained with reference to FIG. 5. The current sense circuit 542 and voltage sense circuit 548 provide corresponding current sense and voltage sense signals, which are multiplied by a multiplier component 551, and the resulting signal is scaled and provided to the network 557. This resulting signal can represent instantaneous power dissipated in the MOSFET 515 and is shown in FIG. 5 as a current. When applied to the network 557, the resulting signal charges the capacitor C5.

As described above, the voltage on the capacitor C5 (at node 563) can represent or model the junction temperature of the MOSFET 515. The resistor R7 can represent a thermal resistance between the junction and the case, and current through the resistor R7 can represent heat that flows from the junction to the case. Thus, the voltage on the capacitor C5 is determined both by the current flowing into the capacitor C5 from the multiplier 551 and scaling component and the current flowing out of the capacitor C5 through the resistor R7. For example, if the current flowing into the capacitor C5 is larger than the current flowing out, the voltage on the capacitor will rise. In an analogous manner, if the power dissipated in the MOSFET 515 generates heat at a rate greater than it can be exhausted through the case, the temperature of the junction will continue to rise.

As described above, appropriate selection of the components of the network 557 to correspond to appropriate thermal parameters of the MOSFET 515 can result in the voltage at node 563 modeling the relative junction temperature of the MOSFET 515. That is, with the right components, the voltage at node 563 can model the relative junction temperature of the MOSFET 515. When this voltage (modeled temperature) reaches a threshold point (e.g., relative to the reference voltage V4 at operational amplifier U4, and with reference to FIGS. 8A-8E, at point 701), the gate control signal 524 can cause the current flowing through the MOSFET 515 to be restricted, so as to prevent the relative junction temperature from increasing further.

Note that in the implementation depicted in FIG. 8E, the junction temperature remains steady after current is limited (starting at point 701). In other implementations, given different control settings, different thermal characteristics, or different current flow scenarios (e.g., pulsed current through the MOSFET 515), the junction temperature may decrease such that the SOA control circuit 533 may not need to limit current for some period of time (e.g., until the junction temperature heats back up, as modeled by the voltage at node 563).

Figure 16:
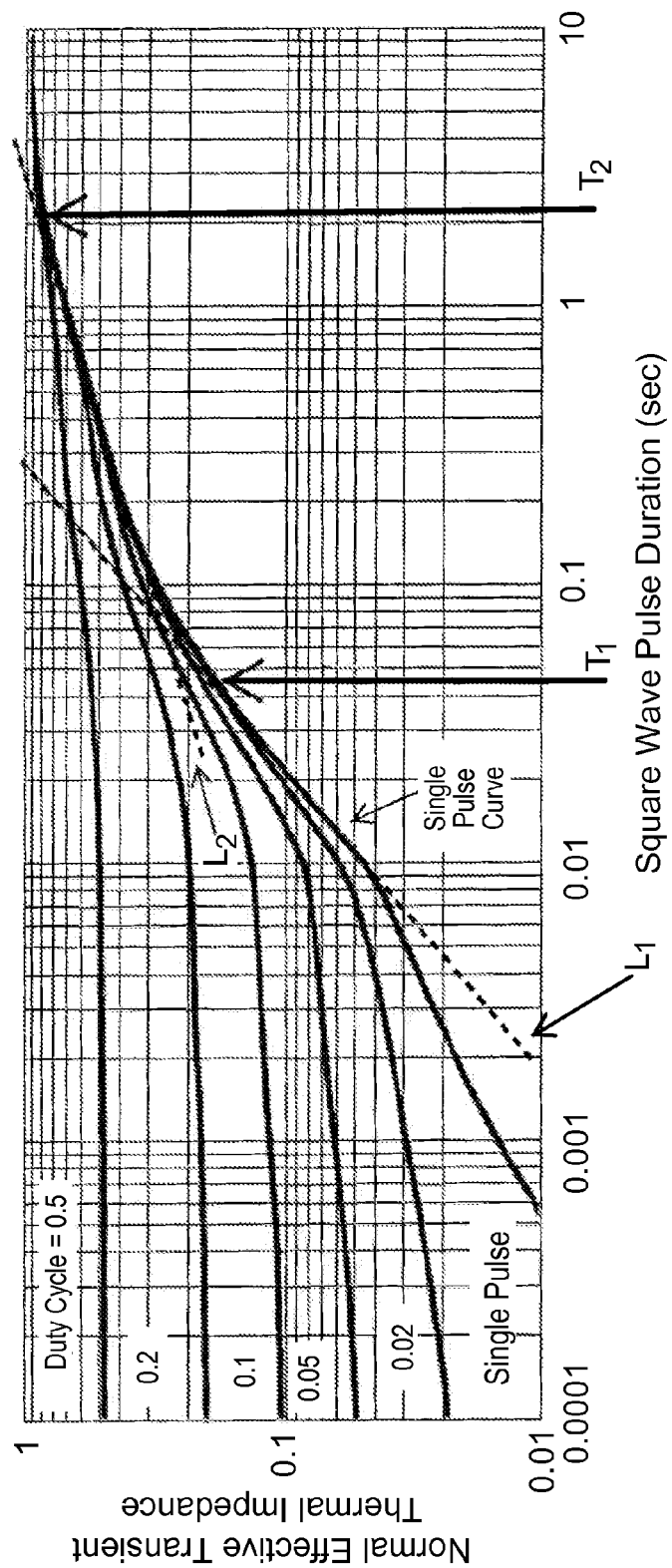
FIG. 16 is an example transient thermal resistance plot that may be used to determine time constants for modeling the thermal behavior of a transistor.

A method for synthesizing the resistance and capacitance values for use in the thermal model network 557 (FIGS. 5, 9) will be discussed with reference to FIG. 16. FIG. 16 shows an example of the normalized effective transient thermal impedance for a transistor similar to the transient curves of FIG. 3. Using the single pulse curve, the breakaway points, where the curve has inflections indicating a diminishing slope, may be identified using for example lines $L_1$ and $L_2$ as shown in the figure. Note that since the change in slope shown at 0.01 seconds is positive (increasing slope), this point may be ignored for this analysis. In the example in FIG. 16, the curve may be approximated using the two breakaway points $T_1$=0.043 s and $T_2$=2.1 s shown. The RC time constants for the network 557 (FIGS. 5, 9) may be calculated based upon the breakaway points in the single pulse transient thermal impedance providing a simple and an effective approximation. The thermal resistances provided by the manufacturer may be used to set the resistance values using a convenient scaling factor. For example, assuming the datasheet specifies 13° C./W for the junction-to-case thermal resistance ($R_{JC}$=13° C./W) and 60° C./W for the junction-to-air thermal resistance ($R_{JA}$=60° C./W) and using a scaling factor of 10,000, the resistances for R7 and R8 (FIGS. 5, 9) may be set to 130K and 470K, respectively. Using these resistance values and the two time constants derived from the transient thermal impedance plot, $T_1$=0.043 s and $T_2$=2.1 s, the capacitance values of C5 and C4 (FIGS. 5, 9) may be readily calculated. C5=T1/R7=0.043/130 k=0.33 µF and C4=T2/R8=2.1/470 k=4.47 µF. Note that these calculated values are provided here for purposes of example; different example values are shown in the figures.

Figure 9:
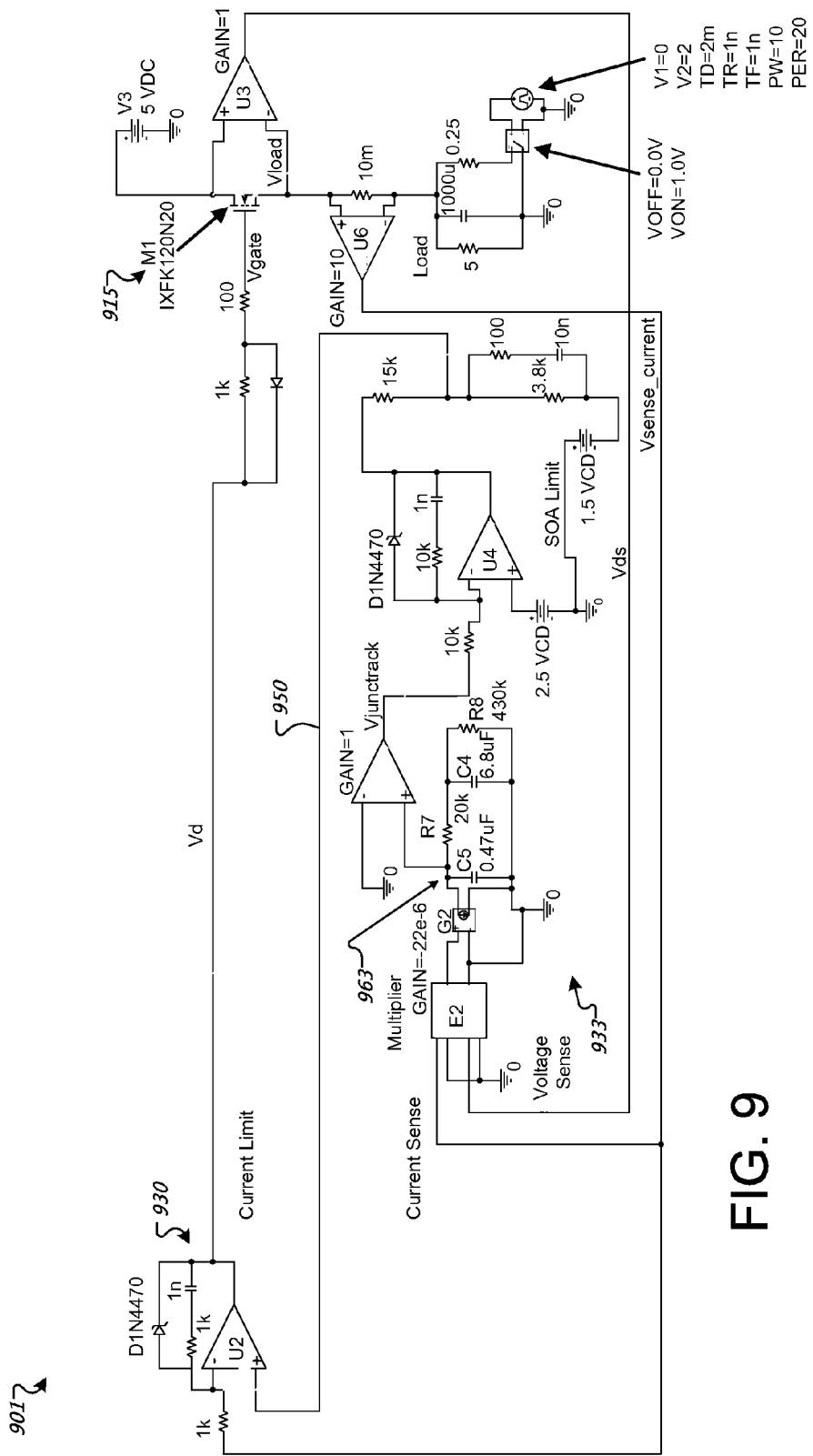
FIG. 9 is another example circuit that performs a similar function as the circuit shown in FIG. 5.
Figure 10A:
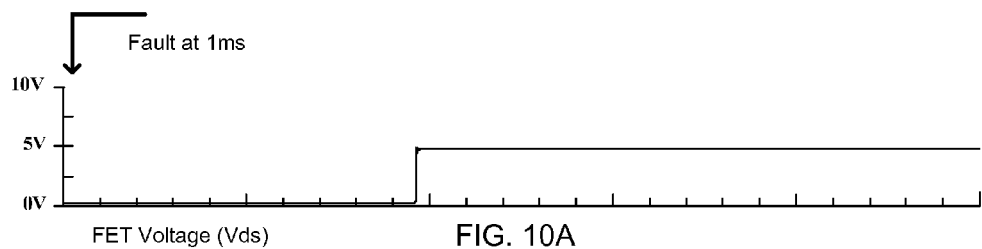
FIGS. 10A-10E are plots illustrating various aspects of the circuit shown in FIG. 9, during a fault condition.
Figure 10B:
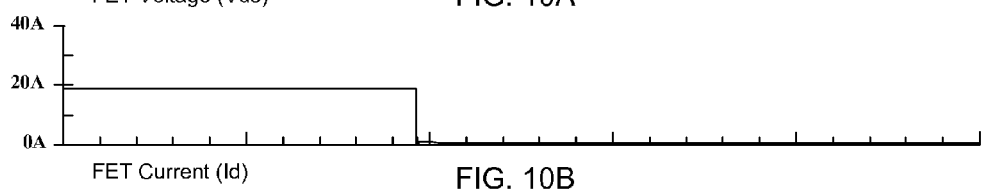
Figure 10C:
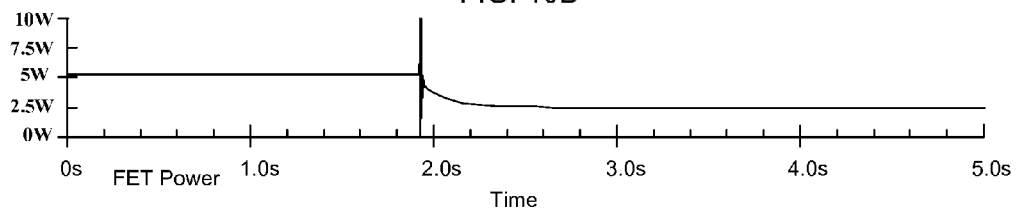
Figure 10D:
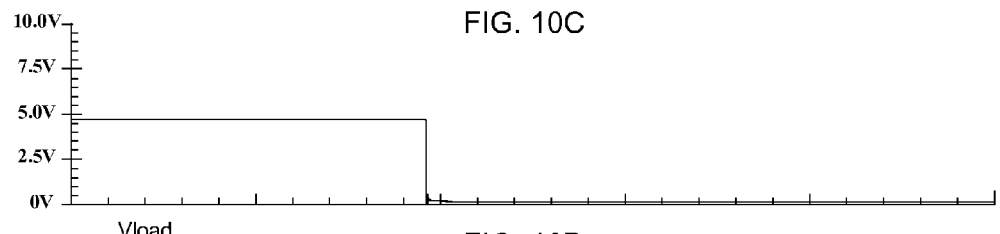
Figure 10E:
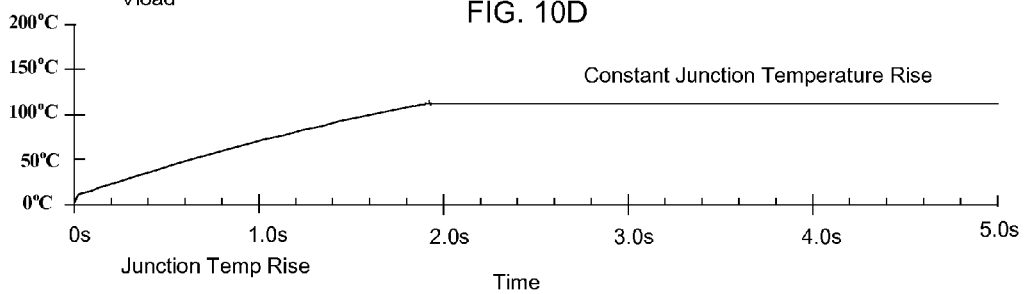

The circuit 501 that is shown in FIG. 5 can be modified in various ways. For example, the circuit 901 in FIG. 9 is a variation of the circuit 501, in which an output 950 of an SOA control circuit 933 is employed to directly control a set point for a current control circuit 930. As depicted in FIGS. 10A-10E, the circuit 901 functions in substantially the same manner as the circuit 501. That is, junction temperature is again modeled, and current through a MOSFET 915 is restricted when a modeled junction temperature (e.g., a voltage at a node 963) reaches a particular threshold.

An ambient temperature sensor can also be added to the circuit 501 (ambient temperature sensor not shown). That is, in some implementations, an ambient temperature sensor, such as a thermistor, diode or other device, can be used to adjust the SOA control circuit 533, e.g. by reducing the power for higher ambient temperatures and increasing power for lower ambient temperatures. More particularly, a higher ambient temperature can reduce a reference signal to the SOA control circuit 533, thereby reducing the allowable temperature rise within the MOSFET 515; a lower ambient temperature can increase a reference signal to the SOA control circuit 533, thereby increasing the allowable temperature rise within the MOSFET 515. Alternatively, the sensor may be connected to allow the voltage at node 563 to represent the absolute junction temperature (as compared to the relative junction temperature). In implementations that include an ambient temperature sensor as described, absolute junction temperature can be effectively regulated, rather than temperature rise above the ambient temperature. When present, the sensor can be, for example, incorporated into a circuit that provides an overall offset voltage (e.g., other than ground) to the network 557, incorporated into a reference circuit that adjusts the reference voltage V4 in the U4 device, or incorporated into another circuit in a manner that adjusts an appropriate reference voltage or current.

As discussed above with reference to FIGS. 5 and 9, a control circuit for an electronic switch, such as a MOSFET, can include a current control loop (e.g., current control loop 530 or 930) and an SOA control loop (e.g., SOA control loop 533 or 933). In some implementations, additional control loops can be added to provide additional levels of control or additional features. In particular, for example, some loads may generate noise or ripple current (e.g., in the form of differential current) that may be conducted back into the power supply; to keep the noise from being conducted back into the power supply (where the noise may possibly adversely affect other loads powered by the power supply), some of the same circuitry used to control overall current through an electronic switch or to maintain operation of the electronic switch within an SOA can also be used to dynamically filter the noise from getting back to the power supply. That is, with reference to FIG. 5, another control loop (not shown) can be added to modulate the gate drive control signal 524 in a manner that enables the MOSFET 515 to actively filter noise (e.g., noise generated by the load 521). In particular, an active noise filtering loop (not shown) can receive as input a drain current sense signal (e.g., from the current sense circuit 542) and a drain-source voltage signal (e.g., from the voltage sense circuit 548). Because the current sense circuit 542 and voltage sense circuit 548 are already input to other gate control signal circuits (e.g., a current control circuit 530 and an SOA control circuit 533), it can be efficient and straightforward to apply the voltage and current signals to a third control circuit for active filtering that can also modulate the gate control signal 524.

Active noise filters are described in EMI Filter Circuit, Briere et al., U.S. Pat. No. 6,898,092, issued May 24, 2005, and in Active Filtering, Vinciarelli et al., U.S. application Ser. No. 10/897,537, filed Jul. 23, 2004 (both assigned to the same assignee as the present application and incorporated here by reference). Active noise filters in the context of circuits that control overall current through an electronic switch or dynamically maintain the electronic switch within an SOA are described below with reference to FIG. 11.

Figure 11:
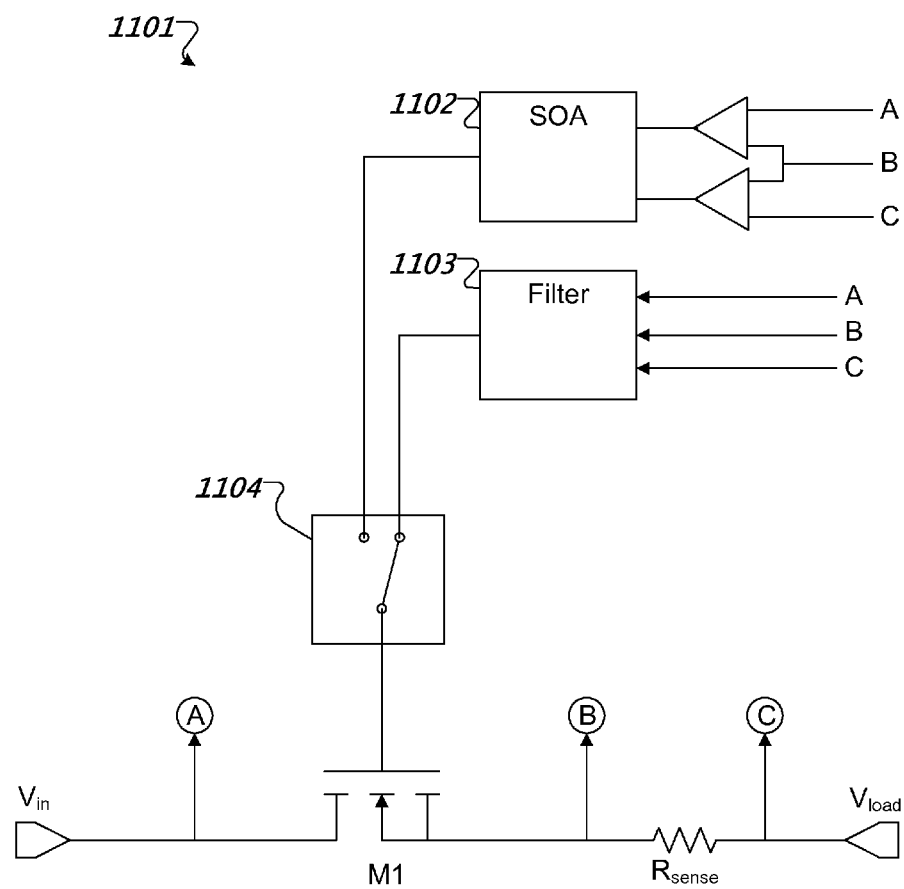
FIG. 11 is a block diagram of a circuit that can be used to perform dynamic SOA control, current limiting, and active filtering of noise in a circuit.
Figure 12:
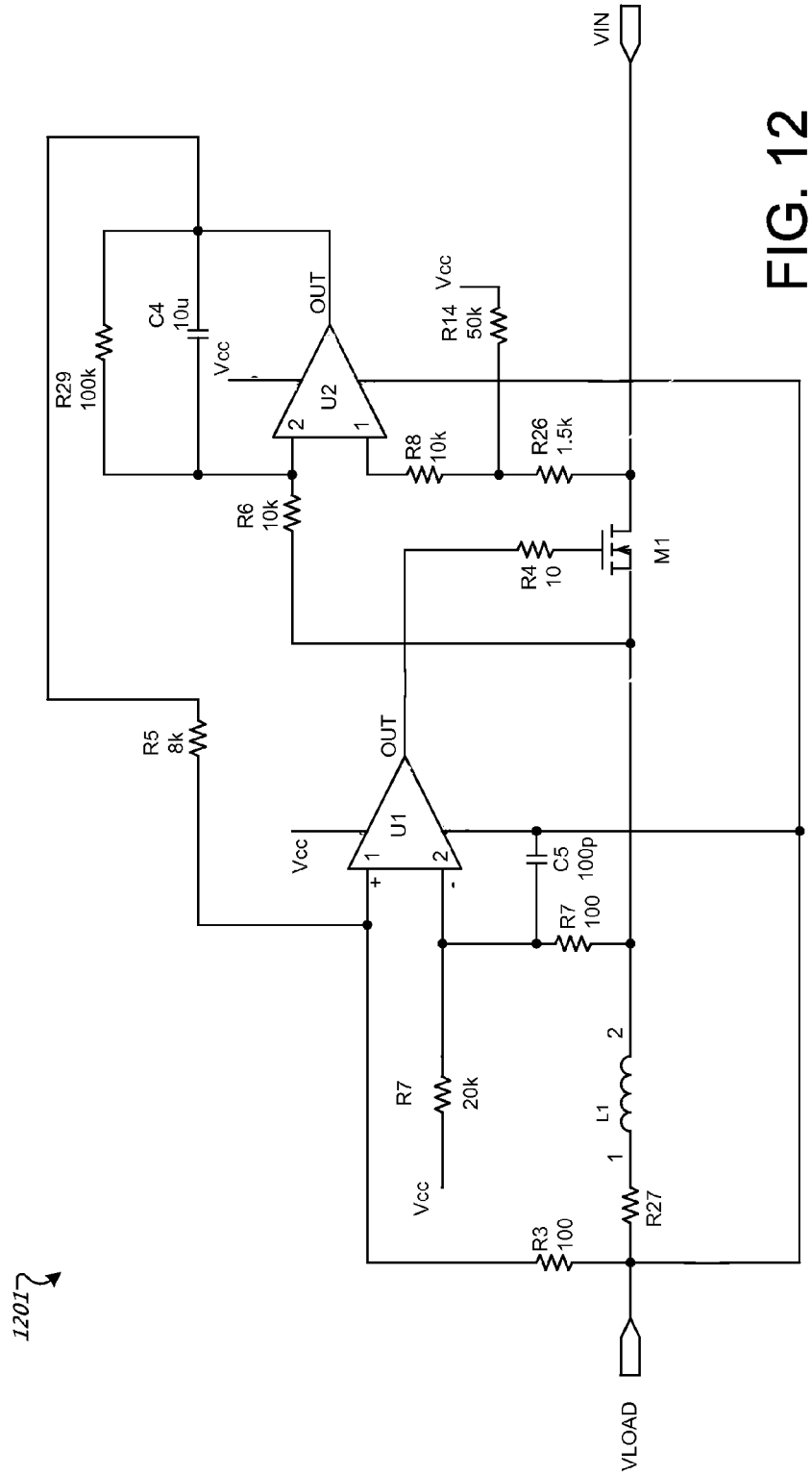
FIG. 12 is an example circuit that may be used for the active filter function shown in FIG. 11.

FIG. 11 is a block diagram of a circuit 1101 that can combine active filtering (block 1103) with other control circuits, such as the SOA control described above (block 1102). In particular, the sense resistor Rsense and the transistor M1 components may be used to perform both filter and SOA control functions. The SOA control circuit 1102 in FIG. 11 operates in the manner described above with reference to FIGS. 4A, 4B, 5 and 9. In addition, a filter block 1103 shown in FIG. 11 can provide an active filtering function (e.g., as described in the references above). A circuit for performing active filtering with dynamic headroom control is shown in FIG. 12.

In some implementations, such as the one shown in FIG. 11, in which the filtering function and SOA control can be provided by common components, one function may dominate over the other function at particular times. For example, the SOA current limit function may only be applied to the MOSFET M1 during a high-current condition, such as at system start-up with a capacitive load, during "hot" board insertion, or during a fault condition in which a high current is drawn through the MOSFET M1. At other times (e.g., when any capacitive load is fully charged and in the absence of a fault), the active filtering function may dominate. The multiplexer block 1104 in FIG. 11 may be used to switch between the two functions.

In particular, in some implementations, the active filtering function establishes an operating point for transistor M1 which may be overridden by the SOA control circuit depending upon the junction temperature. Absent the presence of the filtering function and any fault condition, the SOA control would otherwise keep the MOSFET M1 in an Rdson state (in the saturation region, or in a "power good" state). That is, absent the active filtering circuitry, the SOA control circuitry could drive the MOSFET M1 to an Rdson state, in which power loss is minimized. In some implementations, the active filtering circuitry maintains the MOSFET M1 just outside the Rdson region, in the triode region, where the resistance of the MOSFET M1 can be adjusted in a relatively linear manner. In such implementations, the filter 1103 can detect differential current, or noise, created by the system load by sensing a voltage drop across the Rsense resistor.

Based on the detected differential current, the filter 1103 can influence the circuit 1101 to modulate the resistance of the MOSFET M1 so as to present a nearly constant current to the input power source and cancel reflected load noise current that would otherwise flow back into the power supply. That is, as the noise current dips, the MOSFET M1 resistance can be dynamically lowered, and as the noise current increases, the MOSFET M1 resistance can be dynamically raised, such that the overall impedance (and therefore current draw) appears to the power supply as relatively uniform. In some implementations, providing the filtering function and SOA control function with common components can save significant board space (e.g., by eliminating the need for separate, passive filtering components).

In some active filtering applications, the MOSFET M1 is maintained just barely out of the Rdson region because the magnitude of the ripple current being filtered may only be in the range of tens of milliamps—requiring only very low levels of resistance modulation in the MOSFET and therefore requiring only a slight headroom bias voltage or DC power loss. That is, the headroom voltage can be set very low (100 mV to 300 mV) by the circuit, depending on the MOSFET M1 triode characteristics, to minimize power dissipation versus the magnitude of ripple or noise current reduction (i.e., the effective attenuation of the filter.)

In some implementations (not shown), the active filter and SOA control can be active at the same time. For example, corrections from the filter circuit 1103 to remove noise may be combined with the output of the SOA control circuit to drive the transistor M1 for example using bandwidth separation between the SOA and active filter control loops. That is, the SOA loop can operate as a low frequency band-pass circuit, while the active filter can operate as a high-pass filter. In such implementations, the two functions can function somewhat independently and multiplexer 1104 in FIG. 11 may be replaced with a summing junction.

FIG. 12 is an example of a circuit 1201 that may be used to implement the filter functions 1103 shown in FIG. 11. Using the filter circuit 1201, the combination filter and SOA circuit 1101 in FIG. 11 can perform both active filtering and SOA control over a frequency range of 10 kHz to 30 MHz (see FIG. 13, described in more detail below), using the same current sense and drain-source voltage sense circuits for both functions. As the reader will appreciate, employing these sense and MOSFET control circuits for two separate functions can be cost effective and can be particularly advantageous in applications involving switching power to highly capacitive loads. In particular, it may be possible to use smaller power switches in such applications.

Figure 13:
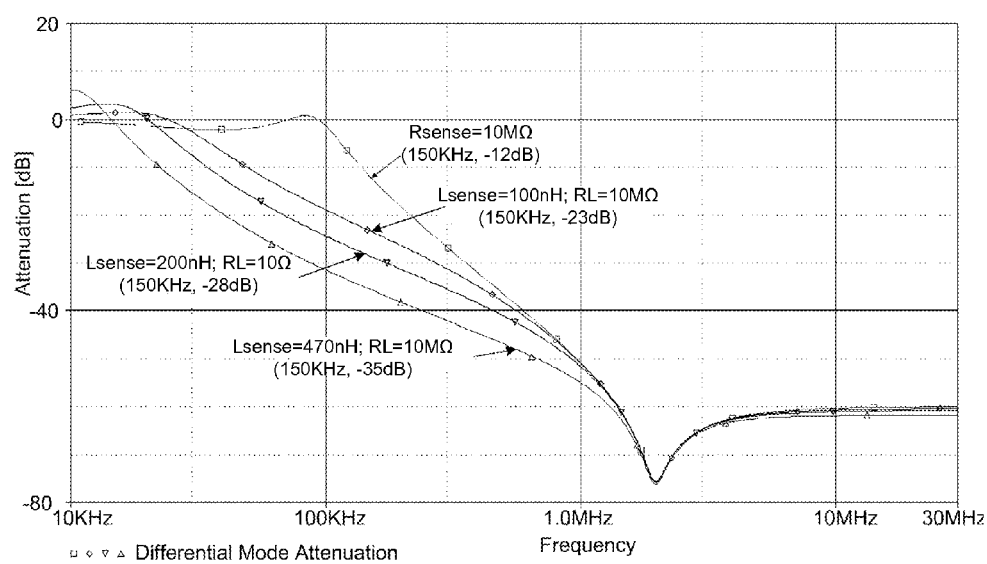
FIG. 13 is a plot of frequency response showing example dynamic filtering capabilities of the circuit shown in FIG. 12.

FIG. 13 shows a plot of attenuation versus frequency of noise or ripple current that may be achieved by the circuit 1201. As depicted by the plots in FIG. 13, the active filter portion of the circuit 1201 can create a high impedance to the ripple current. In particular, the circuit 1201 can function by controlling M1's drain-to-source voltage and sensing the AC current in the range of 10 kHz to 30 MHz, i.e. the noise signal, flowing through M1 via the sense resistor. An active filter loop can modulate the resistance of M1 to effectively make switching load noise look like a constant current to the power input bus (VIN). The noise reduction in the frequency range of standard switching power conversion can be several orders of magnitude as demonstrated in the attenuation plots of FIG. 13. Even further noise reduction can be achieved by using a series inductance L1 (FIG. 12) with the sense resistor, as depicted by the curves in FIG. 13 that are associated with an inductance parameter.

Figure 14:
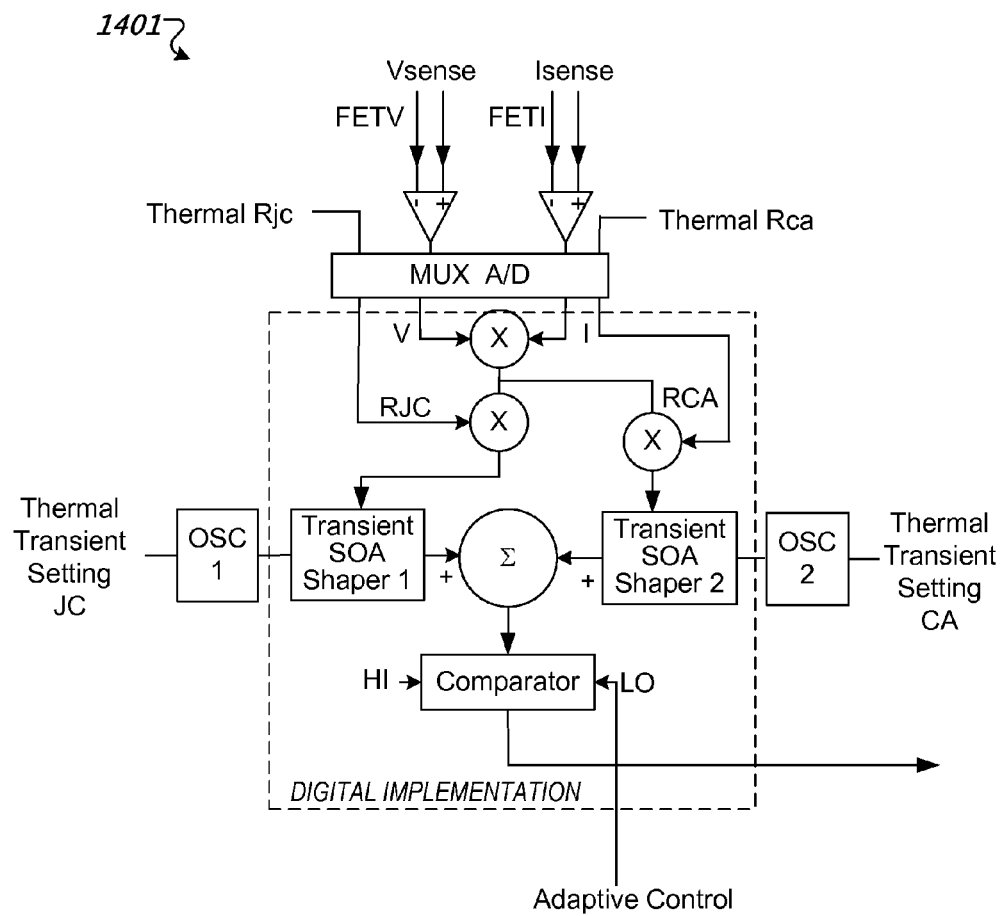
FIG. 14 is a block diagram of a digital controller that can be used to dynamically maintain an electronic switch in an SOA.
Figure 15F:
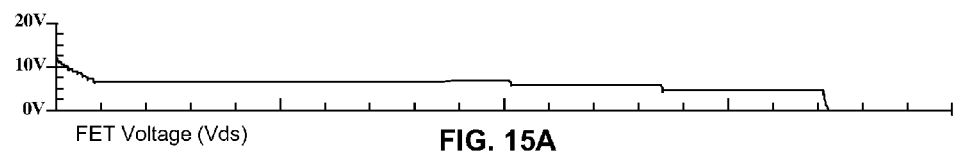
Figure 15F:
Figure 15F:
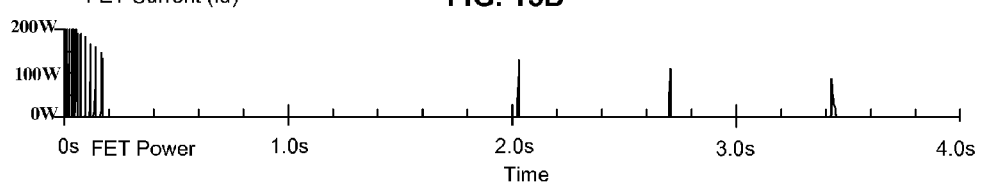
Figure 15F:
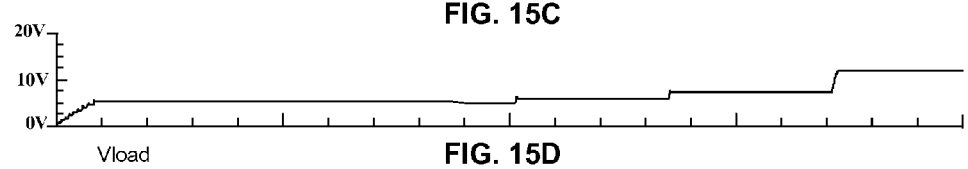
Figure 15F:
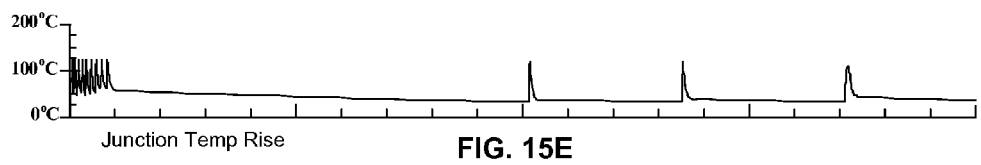
Figure 15F:
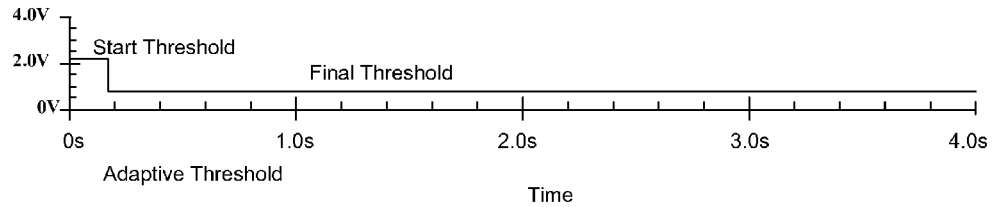

FIG. 14 is a block diagram of a digital control circuit 1401 that may be used to implement the current and SOA control functions described above in connection with FIGS. 4-10 and 16. In some implementations, the digital control circuit 1401 can be used to dynamically control a transistor in a pulsed application for an electronic switch, in order to maintain the electronic switch in a SOA. That is, the digital implementation 1401 can dynamically control an on-time for the transistor (e.g., a duty cycle), or the digital implementation 1401 can determine when the transistor should be off for a period of time to maintain the transistor within a SOA. In some implementations, the digital implementation 1401 can model a rise in temperature from junction-to-case-to-air in a manner that digitally emulates an effective transient thermal response curve (e.g., see FIG. 3), as is described in greater detail below.

As shown, the digital implementation 1401 can digitize thermal resistance values $R_{JC}$ and $R_{CA}$, and sensed voltage and current values FETV and FETI respectively. The digitized voltage and current values, V and I, respectively, can be multiplied to create a digitized power signal, which can represent an instantaneous power consumed by a corresponding device. The digitized power signal can be multiplied by the digitized junction-to-case resistance, $R_{JC}$, and provided to an SOA shaper (Transient SOA Shaper1) that can output a signal that is representative of a resulting rise in temperature from junction-to-case. The digitized power signal can be multiplied by the digitized case-to-air resistance, $R_{CA}$, and provided to a second SOA shaper (Transient SOA Shaper2) that can output a signal that is representative of a resulting rise in temperature from case-to-air.

In some implementations, the SOA Shapers 1 and 2 may be digital filters implemented with a sampling signal and internally programmed filter coefficients. The frequency of the sampling signal can be externally programmed using oscillators OSC1 and OSC2. The coefficients and sampling frequency can be selected to emulate the transient thermal behavior of a transistor (e.g., a FET or MOSFET) in a fast transient region (e.g., SOA Shaper 1) and in a slow transient region (e.g., SOA Shaper 2). Thus, the SOA shapers can essentially emulate normalized transient thermal curves that manufacturers may provide in FET datasheets (e.g., as shown in FIG. 3).

As shown in one implementation in FIG. 14, the outputs of the SOA shapers can be summed to provide a signal representative of a total temperature rise from junction-to-case-to-air. The signal representative of temperature rise can be compared to one or more threshold values to determine whether a corresponding transistor should be turned off (e.g., if the signal representative of temperature exceeds the threshold). In one implementation, two thresholds can be employed—a high threshold and a low threshold. When the representative signal exceeds the high signal, the transistor can be turned off; when the representative signal falls below the low signal, the transistor can be turned back on.

In some implementations, ambient temperature can also be factored in, in order to, for example, control the corresponding transistor based on absolute junction temperature, rather than based on a temperature rise over the ambient temperature. In particular, a signal from a thermistor, diode, or other temperature-sensing device can be digitized and added in the summer before the resulting representative signal (a signal that represents absolute temperature in this case) is compared to appropriate thresholds (which, in such implementations, would be recharacterized to account for absolute junction temperature, rather than temperature relative to ambient temperature).

In one example implementation, the digital implementation 1401 is employed to cycle a transistor on and off with time intervals that are threshold dependent. The lower the low threshold is set, the longer the off-time can be, which provides longer cooling periods for the transistor; the higher the low-threshold is, the shorter the off-time can be, which can be important to initially charging a capacitive load, without allowing the load to discharge too much during the off-times. In some implementations, a balance between allowing the transistor to cool between on-times and initially and effectively charging a load can be achieved by employing multiple thresholds. At startup, a high threshold (e.g., a series of on-off cycles with short off times) can be used to quickly charge a capacitive load. Once the load is charged, the threshold can be reduced (e.g., the off times in the on-off cycles can be increased), which, in some implementations, can facilitate indefinite operation in a fault condition. Various thresholds can be employed, and in some implementations, the difference between a high and low threshold can be quite great (e.g., a high threshold may correspond to an off time of 5 ms, while the low threshold may correspond to an off time of several seconds).

Two thresholds are described in the above example, but multiple thresholds numbering more than two can be employed. Moreover, the digital implementation 1401 is described in the context of controlling pulsed applications, but the digital implementation could be employed to control an electronic switch in analog implementations (e.g., in which currents are controlled over a range).

FIG. 15 illustrates plots of various simulated parameters of a FET controlled by the digital implementation 1401 in a scenario in which a highly capacitive load is driven. In particular, FIG. 15B illustrates a burst of current pulses having short off times, during which time a capacitive load is charged (as depicted in FIG. 15D). During this time, the FET voltage decreases (FIG. 15A); the bursts of power dissipated in the FET also decrease during this time (FIG. 15C). As depicted by FIG. 15F, the low threshold may change from a starting low threshold to a final low threshold after the load is initially charged. Once the final low threshold is applied, the off times between pulses increase, allowing the junction temperature to cool, after heating up in response to the bursts of initial power consumption corresponding to the load charging (see FIG. 15E).

Figure 17:
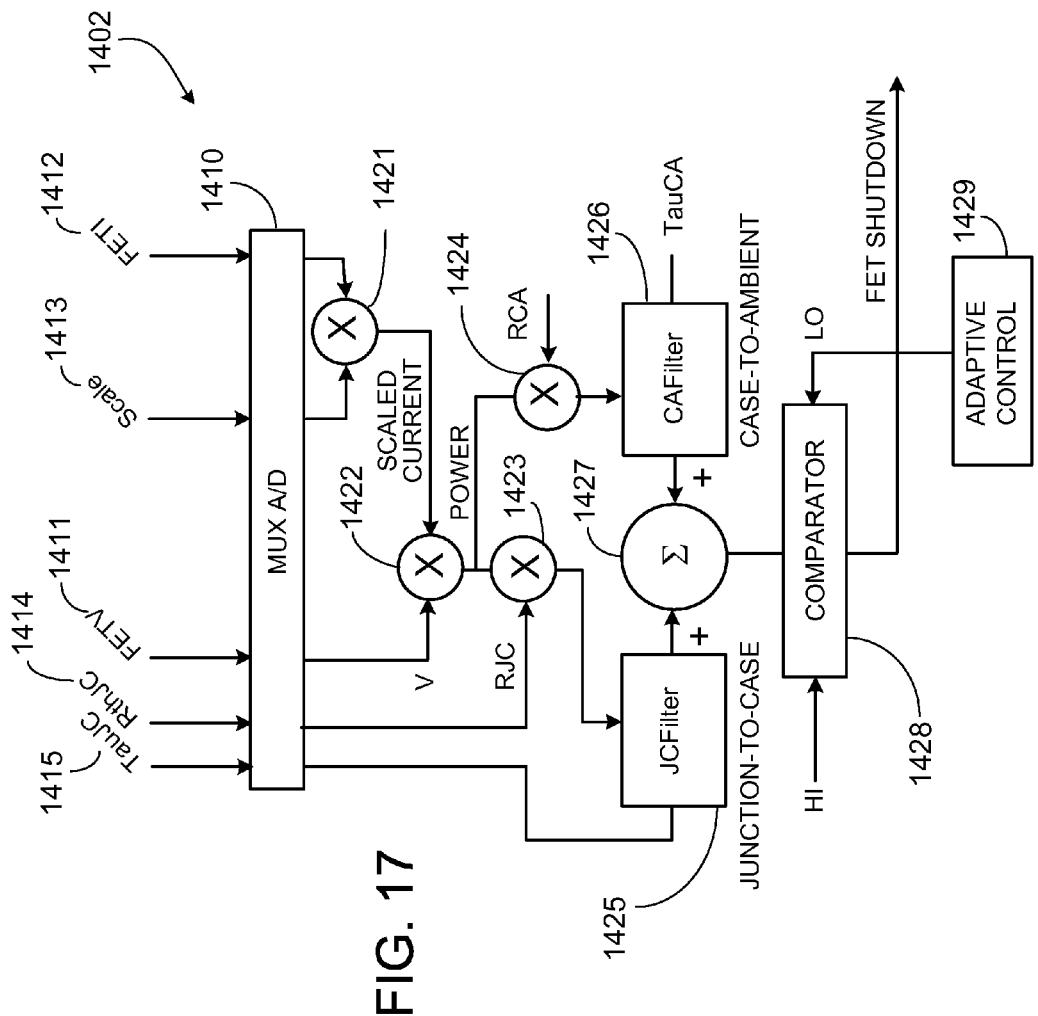
FIG. 17 is a block diagram of a digital controller that can be used to dynamically maintain an electronic switch in an SOA.

FIG. 17 is a block diagram of another digital control circuit 1402 that may be used to implement the current and SOA control functions described above, e.g. to turn the power device ON and OFF in pulsed operation to maintain operation of the power device within safe operating areas. The circuit 1402 of FIG. 17 may be considered and will be described below in three conceptual stages: a pre-filter stage which acquires data, a filter stage which processes the data, and a post-filter or control stage which acts on the results.

The pre-filter stage may include input circuitry to receive analog signals and convert them into digital signals. For example an analog-to-digital converter (ADC) with an input multiplexer may be used to acquire a plurality of input signals, i.e. voltages or currents, representative of fixed and operating circuit parameters and physical characteristics, such as instantaneous electrical (voltage and current) stresses, thermal impedance values, and scaling factors, etc. Although shown as a single functional block, the ADC multiplexer combination may be implemented with a plurality of ADCs, with or without multiplexers, each dedicated to one or more input signals. Additionally, a Nyquist filter may be used to filter the signals input to ADC for anti-aliasing, particularly if the ADC is low speed. The input signals may include voltage signals representing the voltage (FETV) across the power device, the current (FETI) through the power device, a scale factor (Scale) representing the factor by which the FETI signal is related to the actual current through the power device, the power device's steady state junction-to-case thermal resistance (RthJC), and a junction-to-case filter setting (TauJC) may be provided at inputs 1411, 1412, 1413, 1414, and 1415 respectively. The input signals may be selected (using the multiplexer) scaled in the analog front end of the Analog-to-Digital converter ("ADC") 1410, and output as digital signals, e.g. numeric representations. Some input signals, such as the power device voltage (FETV), may be converted using multiple ranges to enhance conversion accuracy, e.g. by optimizing the use of the Analog-to-Digital converter input scale.

As shown in FIG. 17, a Scaled Current signal may be produced by multiplying the current (FETI) and the Scale signals, e.g. using a hardware multiplier 1421. A Power signal may be produced by multiplying the voltage (FETV) and Scaled Current signals for example using a hardware multiplier 1422. The Power signal, as its name implies, represents the instantaneous power dissipation in the power device. The above multiplications may be performed in floating point arithmetic using overflow protection to prevent rollover.

Because the predominant thermal time constants of typical power devices such as MOSFETs are rather far apart, the filter may be readily divided into a number of decoupled parallel paths, e.g. FIG. 17 shows two parallel paths: one for the junction-to-case filter path and one for the case-to-ambient filter path. Using individual filters connected in parallel to model the power device enables use of simpler filter elements requiring less circuitry or computational load, saving space and cost. For example, single order filters may be used for each of the filters which for example may allow the elimination of multipliers required by higher order filters for scaling coefficients as discussed below in connection with FIGS. 19-21. Although two filter paths are shown, the filter may include any number of paths each having an appropriate number of poles and zeros to generate the desired response. The outputs of the filter paths may be summed as shown in FIG. 17 to produce a composite temperature rise signal.

Figure 18:
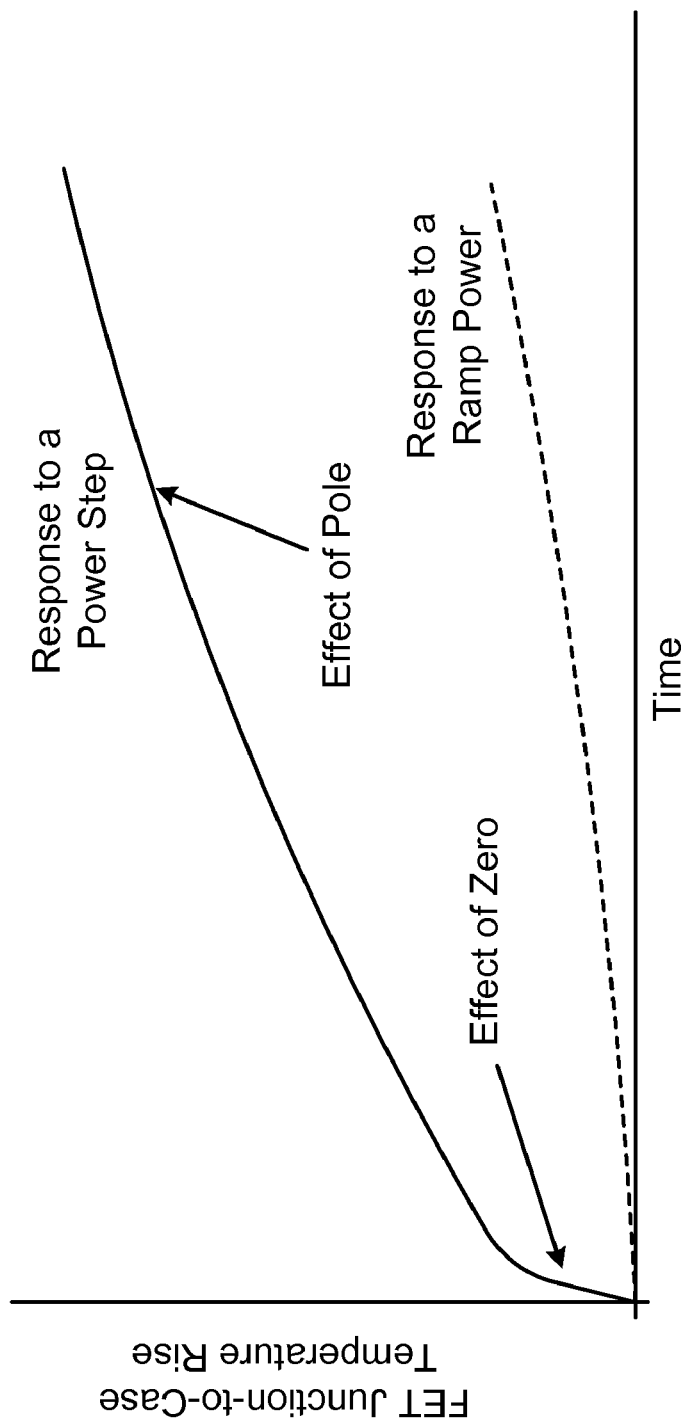
FIG. 18 is shows a filter response to a step increase in power.

Starting with the junction-to-case path in FIG. 17, a signal, RJC, having a value representative of the steady state junction-to-case thermal resistance from the power device may be provided as an input to multiplier 1423 for programming the filter response. Although shown as user inputs for programming the filter, the values RJC, TauJC, RCA, and TauCA, and other filter response shaping parameters (discussed in more detail below) may alternatively be programmed for example during manufacture of the SOA control circuit or hardwired in systems where programmability is not required. The product of the Power signal and the RJC value is output by multiplier 1423 (which may for example be a hardware multiplier) as an instantaneous junction-to-case signal which is input to the junction-to-case filter 1425. Filter 1425 may be digitally programmed with a digitized value, TauJC, to set the filter coefficients, e.g. a pole, p1, and a zero, z1 representing the internal thermal characteristics of the power device. The zero, z1, provides a filter response for fast power surges, i.e. a step input in power produces an initial step output from the filter as illustrated by the step response in FIG. 18. The zero in the filter response is chosen to model the temperature rise in a power device, e.g. a MOSFET, in response to a surge in power dissipation. The rapid rise in filter output may be used by the SOA control circuit to protect against localized heating in the power device as explained in more detail below. A pole, p1, in the filter response may be used to model the rising and decaying exponential nature of the temperature rise in the power device for example as the device heats up or cools down. Referring again to FIG. 18, the effect of the pole in relation to the power step is shown as a gradual rise in temperature following the initial jump produced by the zero. The output of filter 1425 is a signal representative of the junction-to-case temperature rise. (Methods for determining the filter parameters are discussed in more detail below in connection with FIGS. 23-24.)

As shown in FIG. 17, another filter 1426 may be provided for the case-to-ambient temperature rise. In the case-to-ambient path, the parameter, RCA, having a value representative of the steady state case to ambient thermal resistance may be provided as a user input or as a programmed value to multiplier 1424, which may be a hardware multiplier. The product of the Power signal and the RCA value is output by multiplier 1424 as an instantaneous case-to-ambient temperature signal which may then be input to the case-to-ambient filter 1426. Filter 1426 may be digitally programmed with a digitized value, TauCA, to set the filters coefficients, e.g. a pole, p2. The output of filter 1426 is a signal representative of the case-to-ambient temperature rise. The outputs of the two filters 1425 (junction-to-case) and 1426 (case-to-ambient) are summed, e.g. by a hardware adder 1427, to produce a composite signal representative of the junction temperature rise in the power device.

Figure 19:
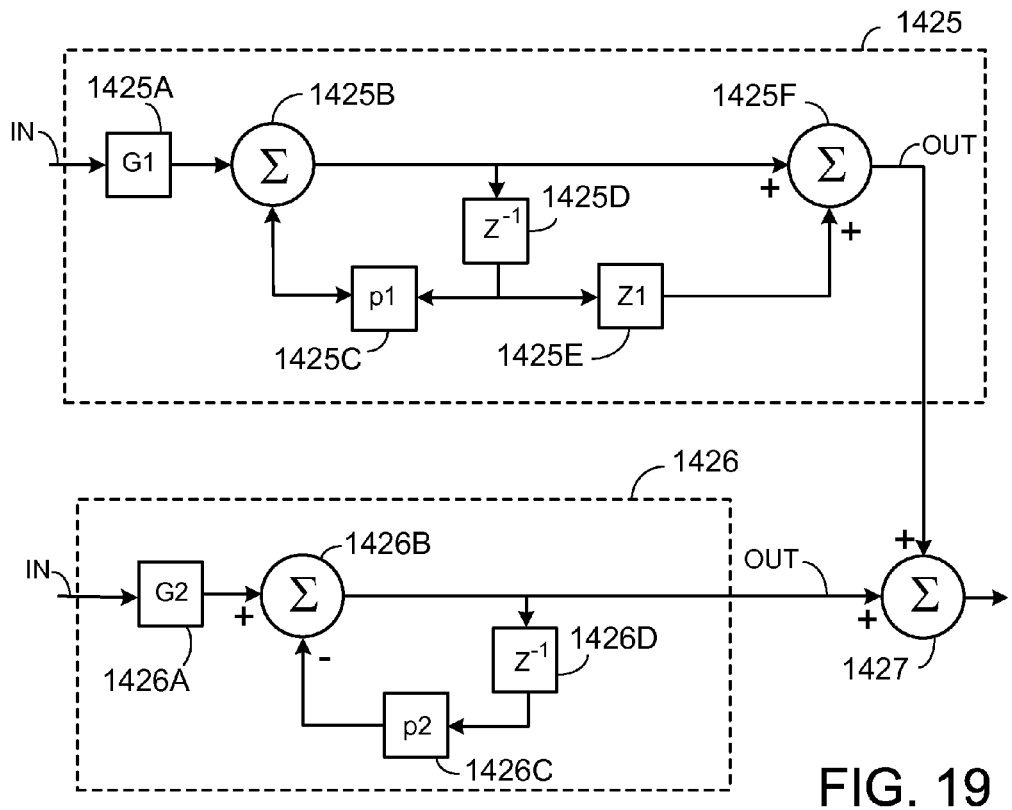
FIG. 19 is a block diagram of a digital filter.

Referring to FIG. 19, the filter stage of circuit 1402 will be discussed in greater detail. FIG. 19 shows the internal construction of filters 1425 and 1426 including the canonical filter blocks making up the filters. FIG. 19 shows filter 1425 including a filter normalization block 1425A, summing blocks 1425B, 1425F, coefficient blocks 1425C and 1425E, and delay block 1425D. The coefficient blocks may be implemented by using multipliers, for example the pole coefficient block 1425C may multiply its input by the value, p1, of its coefficient. Similarly the zero coefficient block 1425E may multiply its input by the value, z1, of its coefficient.

Figure 20:
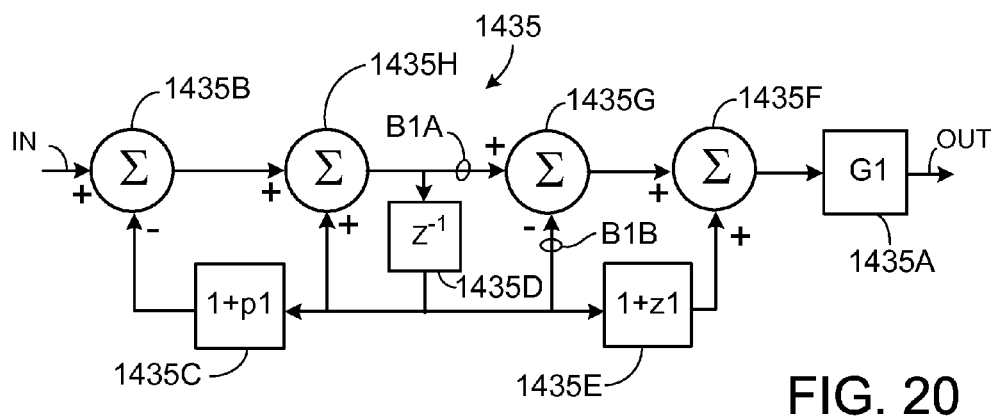
FIG. 20 is a block diagram of a modified digital filter.

Because the pole and zero coefficients, e.g. p1 and z1 may be values very close to unity, they may be expressed as $1/X^m-1$, where X and m are integers. For reasons that will become clear, it is preferable to express the coefficients using integral powers of 2, i.e. X=2. The filter may be modified to avoid the necessity of using floating point multiplications for the pole and zero coefficients if 1 is added to each of the filter coefficients. By adding one to the coefficients, they simplify from the form of $(\frac{1}{2}^m-1)$ to the form $(\frac{1}{2}^m)$ which provides the advantage of being capable of implementation using a simple shift operation. The value to be multiplied by the coefficient $\frac{1}{2}^m$ is simply shifted right m bits, which is the justification for expressing the coefficient in integral powers of two (X=2). The alternative implementation of the junction-to-case filter 1435 shown in FIG. 20 uses coefficients simplified in this manner to eliminate the need for multipliers in the coefficient blocks. The change in each coefficient however requires an additional summing junction: adder 1435H as shown in FIG. 20 is used to compensate for effect of the one added to the pole coefficient (1+p1). Similarly, adder 1435G is used to compensate for the added one in the zero coefficient (1+z1). With the additional adders, the coefficient blocks 1435C and 1435E may be implemented by register shifting operations. For example, the pole and zero coefficients $(1+p1=\frac{1}{2}^{mp})$ $(1+z1=\frac{1}{2}^{mz})$ may be implemented by right shifting the values mp bits and mz bits, respectively. The implementation of FIG. 20 using the shift registers or shift operations is simpler and requires less space on the die.

Figure 21:
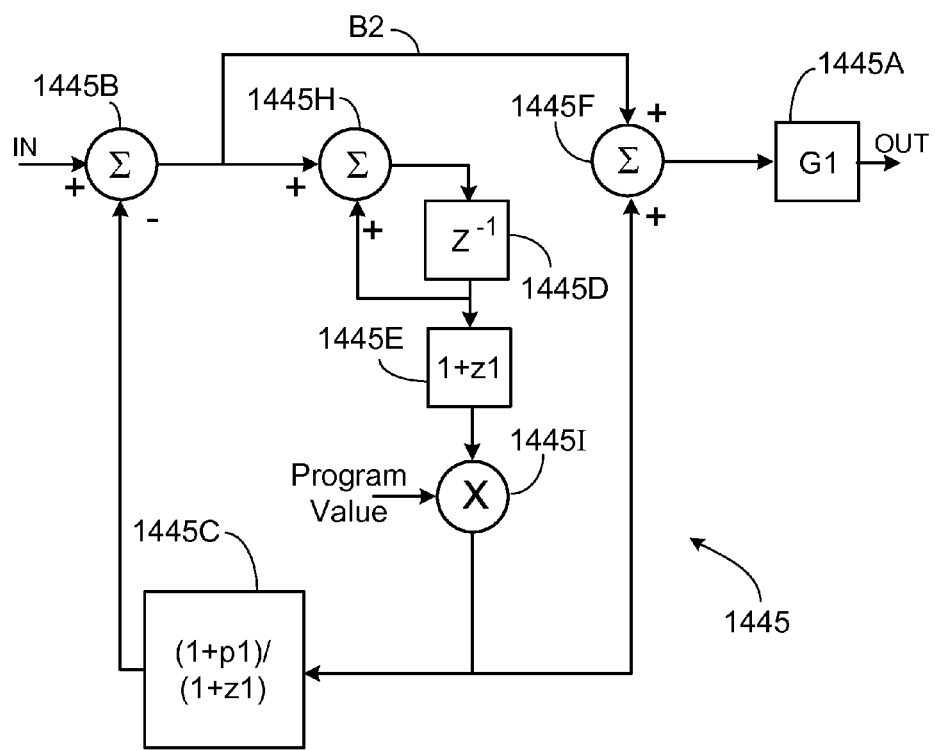
FIG. 21 is a block diagram of another modified digital filter.

The junction-to-case filter (1435; FIG. 20) may be further simplified as shown in FIG. 21. Filter 1435 retains the use of simple shift operations for the coefficients. The division shown in shift block 1445C is simply a right shift of (mp−mz) bits. Adder 1435G may be eliminated by combining two circuit branches B1A and B1B (FIG. 20) into a single branch B2 as shown in FIG. 21. Additionally, in filter 1445 a multiplier 14451 may be added as shown to shape the filter response 1445. The filter 1445 has the advantage of requiring only one multiplier 14451 to shape the filter response allowing the filter to be used in a variety of applications. The programming value shown in FIG. 21 may be used to program the value, TauJC. As described above the filter parameters may be received as user inputs (e.g. as shown as in FIG. 17) or may be programmed in hardware.

The filters shown schematically in FIGS. 19, 20, and 21 may be implemented in a variety of ways for example using hardware adders, multipliers, summers, shift registers, etc. The data paths illustrated schematically in the figures need not be dedicated paths. For example, the devices may be selectively connected to one or more common buses allowing the data to be transmitted from one functional block to another, e.g. from the ADC 1410 to a selected multiplier, 1421, 1422, 1423, or filter 1425 or from a multiplier, 1421, 1422, 1423, 1424, to a selected multiplier 1422, 1423, 1424 or filter 1425, 1426 as required. The bus may use either parallel or serial data transmission to move digital values, e.g. 16 or 23 bit values, between the devices. The bus may also be used for executing test mode commands to control operation of various functional blocks, e.g. by writing commands or data or both to a functional block and reading results from the block. One type of test mode may be used to calibrate or trim the ADC 1410 for each input, e.g. with a gain and offset correction for each input or set of inputs, e.g. stored in nonvolatile digital memory. For example, the ADC 1410 may for each input processed, use the stored scale value for that input to adjust the gain (scaling the resulting acquired value) and add the stored offset value for that input to reduce any bias or DC offset errors. Additionally, programmable devices may be used to implement some or all of the functions.

Depending upon design criteria, such as speed versus circuit area tradeoffs, the hardware multipliers may be reduced in number for example using one multiplier to perform more than one functional block. Digital multiplexing may be used to route inputs to and outputs from the same multiplier to different functional blocks. Selected functional blocks, e.g. digital multipliers and adders, may be implemented in software, where execution time is not critical. The arithmetic operations, e.g. multiplication, may be fixed or floating point, or may consist of right or left register shifts for multiplication by powers of 2, as is the case where a multiplication by a positive or negative power of two is desired. One or more of the multipliers may be replaced with scaling circuits. For example, where the power device current is constant such as when current is regulated, the Power signal may simply be implemented as an appropriate scaling of the FETV signal. The scaling may be implemented digitally, for example, at the control stage (discussed below) by adjusting the Hi and Lo values used by the comparator 1428. Alternatively, scaling can be implemented in an analog circuit, e.g. at the analog input to the ADC.

The control stage evaluates the output from the filter stage and adjusts operation of the power device to protect the device while allowing the power device to function in the circuit to which it is connected. The filter output—the output of summing junction 1427 (junction temperature rise FIG. 19)—may be input to comparator 1428 as shown in FIG. 17. The comparator 1428 may compare the digital value representing the junction temperature rise with a high threshold value (HI) representing the maximum permissible junction temperature and a low threshold value (LO) representing the temperature at which the power device may be turned ON again. If the filter output exceeds the HI value, the power device is turned OFF. As the power device cools, so too will the filter output, i.e. the digital value representing the Junction temperature rise, will decline. When the filter output falls below the LO value, the power device may be turned ON again.

Preferably, the lower threshold is adaptive meaning that it can be changed during operation for example in response to circuit conditions. As an example, the LO value may be reduced each time the power device is turned OFF by the SOA circuit, or may be reduced after a number of ON-OFF cycles, e.g. 16 cycles, to force longer cooling cycles and lower the average junction temperature. The HI threshold may be adaptively set, e.g. by lowering the HI value after one or more ON-OFF cycles under the control of the SOA circuit, either instead of or in addition to adaptively setting the LO threshold. Besides the number of ON-OFF cycles, modifications to the thresholds may be made in response to operating conditions such as the current or voltage stresses on the power device, or its ON time. Multiple values for the thresholds may be stored in a look-up table format. Another control strategy may include turning OFF the power device and keeping it OFF until a supervisory circuit or an operator provides a reset signal, e.g. following a predetermined number of ON-OFF cycles.

When implemented as a general purpose circuit such as shown in FIG. 17, various parameters must be set for the SOA circuit to work properly for the intended circuit environment. For example, the Scale, RthJC, TauJC, and TauCA, HI and LO values must be provided to the SOA circuit 1402 of FIG. 17. One way to set these and any other requisite parameters is to provide programming voltages as inputs to the ADC which may for example be generated using resistors, with a known constant current flowing through each one of them. Alternatively, any one or all of the settings can be generated and transmitted digitally from an external source through a digital bus, such as I$^2$C or SPI or CAN or any other form of digital transmission. Also, such settings could be stored in volatile or non-volatile memory such as EEPROM or Flash.

Figure 22:
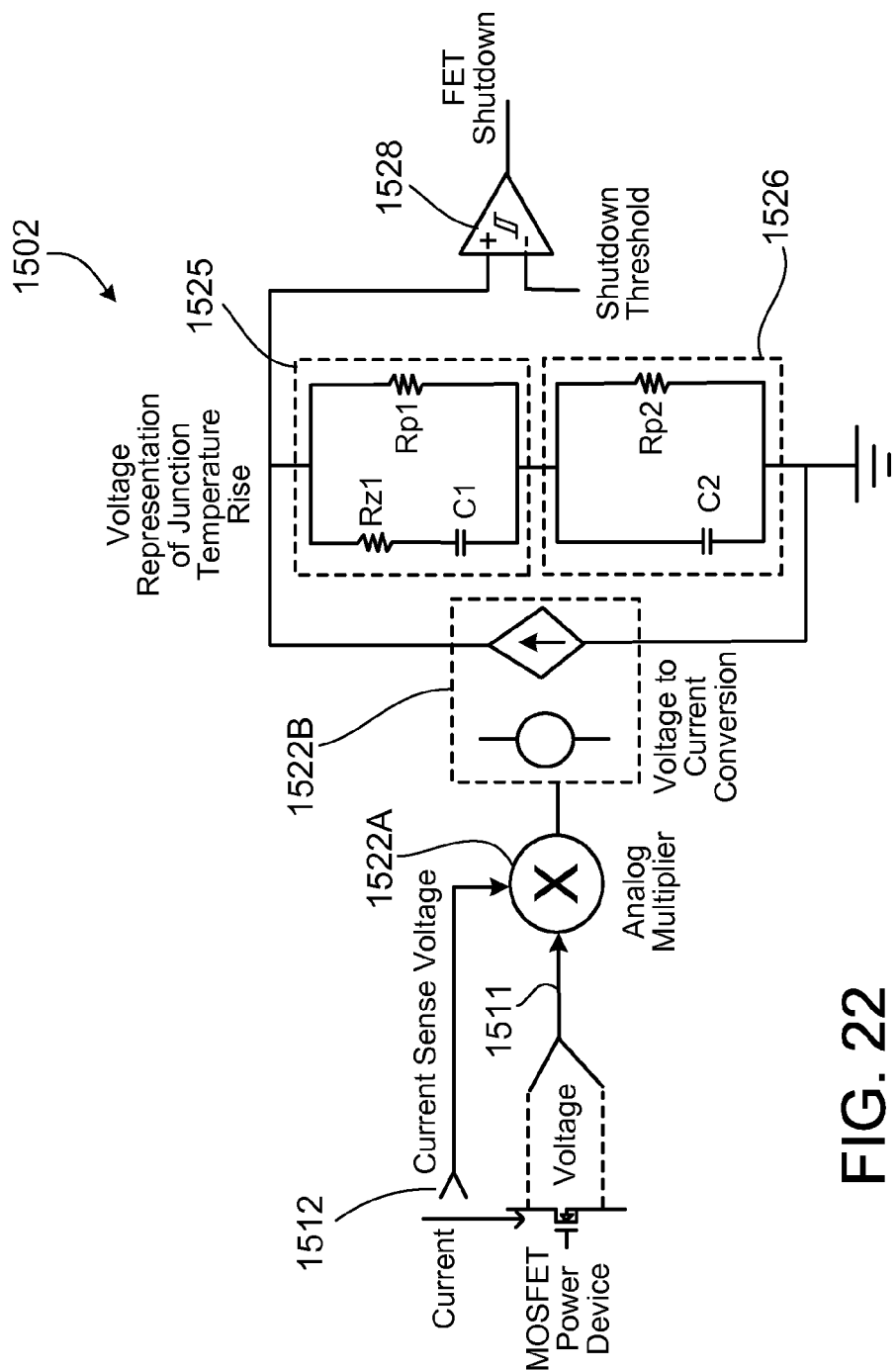
FIG. 22 is a block diagram of an SOA control circuit using analog filters.

An example of an analog SOA control circuit is shown in FIG. 22. The voltage across and current through the power device, shown as a MOSFET in FIG. 22, are input to an analog multiplier 1522A as voltages via inputs 1511 and 1512, respectively. The current through the power device may be sensed as a voltage as shown in FIG. 22. As shown, the inputs are multiplied and the product, which is a voltage representative of power, is output by multiplier 1522A and converted to a current representative of the instantaneous power, e.g. using a transconductance amplifier 1522B. The current may be fed through two series connected passive RC filters, 1525 and 1526. Filter 1525 models the junction-to-case thermal rise and filter 1526 models the case-to-ambient thermal rise. The response of the junction-to-case filter includes a pole, as set by Rp1, Rz1 and C1, and a zero as set by Rz1 and C1. Similarly, the case-to-ambient filter response includes a pole set by Rp2 and C2. The filter voltage, i.e. the voltage across the series connected filters is the sum of the two filtered voltages representing the combined temperature rise from junction-to-ambient. The filter output voltage may be used to control the power device in any of the ways described above in connection with the SOA circuits 401, 501, 901, 1101, 1201, and 1402.

As shown in FIG. 22, the control stage includes a comparison of the filter output voltage to a shutdown threshold, which if exceeded issues a shutdown command to the power device. The comparator may include a hysteresis band providing a low threshold below which the filter output must fall before the power device is turned back ON. Other examples of an analog implementation vary, and can include amplifiers for scaling the analog signals and conversions from voltage to current or current to voltage. Although the analog and digital two-stage single-order filters are preferred for their simplicity and cost effectiveness, the filters need not be limited to two stages or to single order responses.

It will be appreciated that the SOA control circuit may be implemented in a variety of ways, include a mixture of analog and digital sections. For example, a hybrid implementation may consist of analog implementations for the filter stage and a comparator. The comparator output may be provided as an input to a digital control circuit which may also control one or more comparator thresholds or filter parameters.

Using the simplified two-stage single-order filters described above in connection with FIGS. 4, 5, 9, 11, 12, 14, 17, 19-22, the SOA control circuitry may be reduced sufficiently in size and cost to be provided as a single chip-scale package, and may also be packaged together with a power device in for example as a system-in-a package or a grid array package. Alternatively, the controller and power device can be integrated on the same silicon.

The SOA control circuits described above may easily accommodate the special requirements of various power devices. For example, some devices such as trench FETs when operated at higher voltages suffer from uneven current distribution in the die which may require tailoring the SOA curve. For example, the SOA control circuit may adaptively and nonlinearly scale the power signal as a function of the voltage across or current through the power device, e.g. for voltages above a threshold (or currents below a threshold), the SOA circuit may use current squared times voltage for the power signal, and use the standard power signal (current times voltage) for voltages below the threshold.

It may be advantageous to provide a general purpose SOA control circuit that may be used in a variety of applications with a variety of power devices. The general purpose SOA control circuit could be made programmable to allow the user to select the appropriate filter settings, scaling factors, and control thresholds for a specific power device based upon the power device manufacturer's datasheets. For example, the steady state junction-to-case and junction-to-ambient thermal resistances may be used to generate RthJC and RCA (scaled as necessary for use with the SOA control circuit) and settings for TauJC and TauJA may be generated from the transient thermal impedance charts as discussed above in connection with the example of FIG. 16. For clarity, the process will be explained for the derivation of TauJC below in connection with FIGS. 23 and 24.

A first method of generating TauJC for a single-pole response approximation will be explained using a typical junction-to-case transient thermal impedance graph provided by semiconductor manufacturers for FET devices. The time constant, Tau, in an exponential rise of the form M*(1-e$^{-t/Tau}$) may be graphically extracted from a plot by (1) finding the intersection of (a) the derivative of the exponential rise at the origin with (b) the steady state line (M in the equation). TauJC therefore may be extracted from the manufacturer's transient thermal impedance response using the single pulse curve as the exponential rise.

Figure 23:
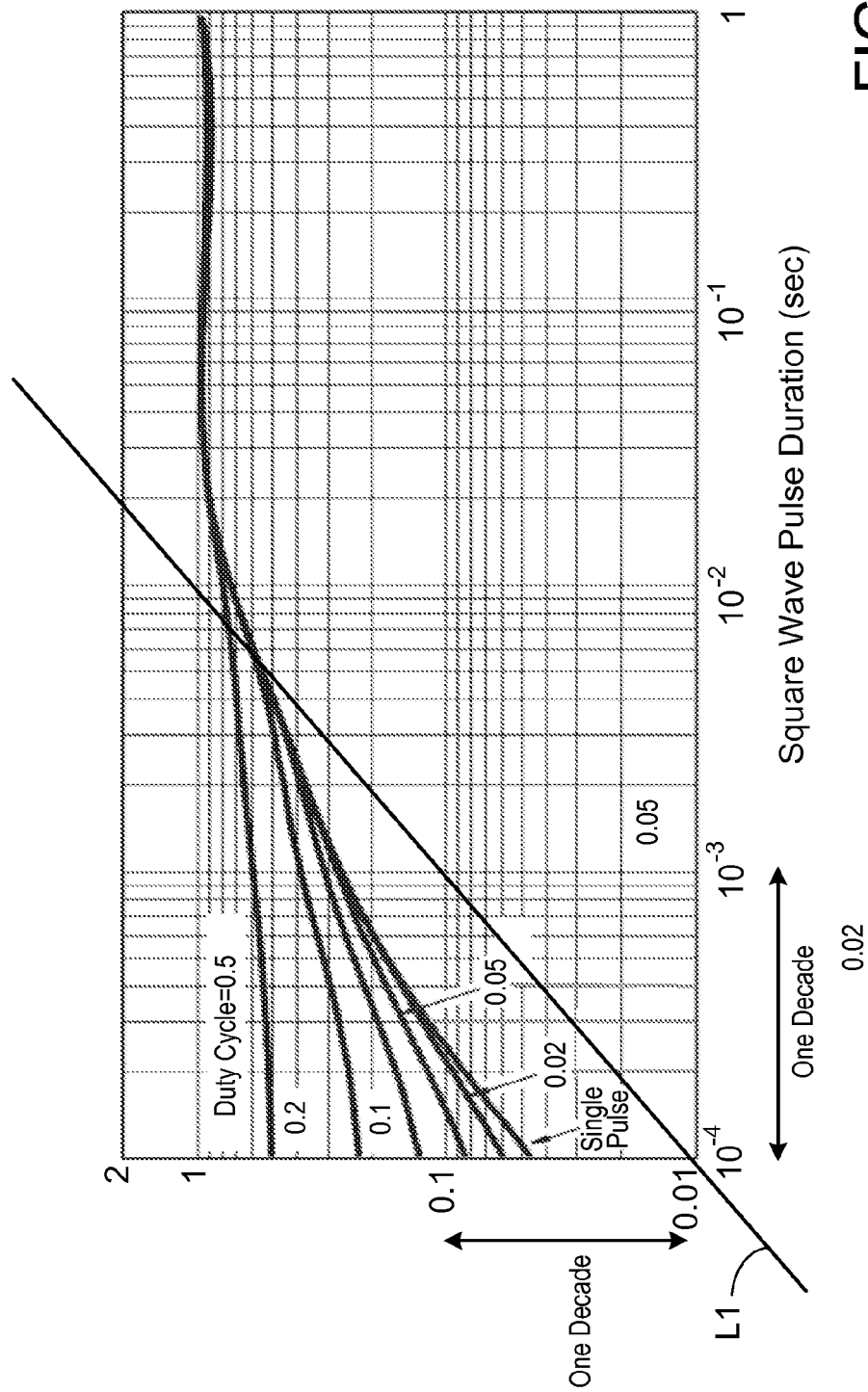
FIGS. 23 and 24 are examples of transient thermal resistance plots used to determine filter parameters.
Figure 24:
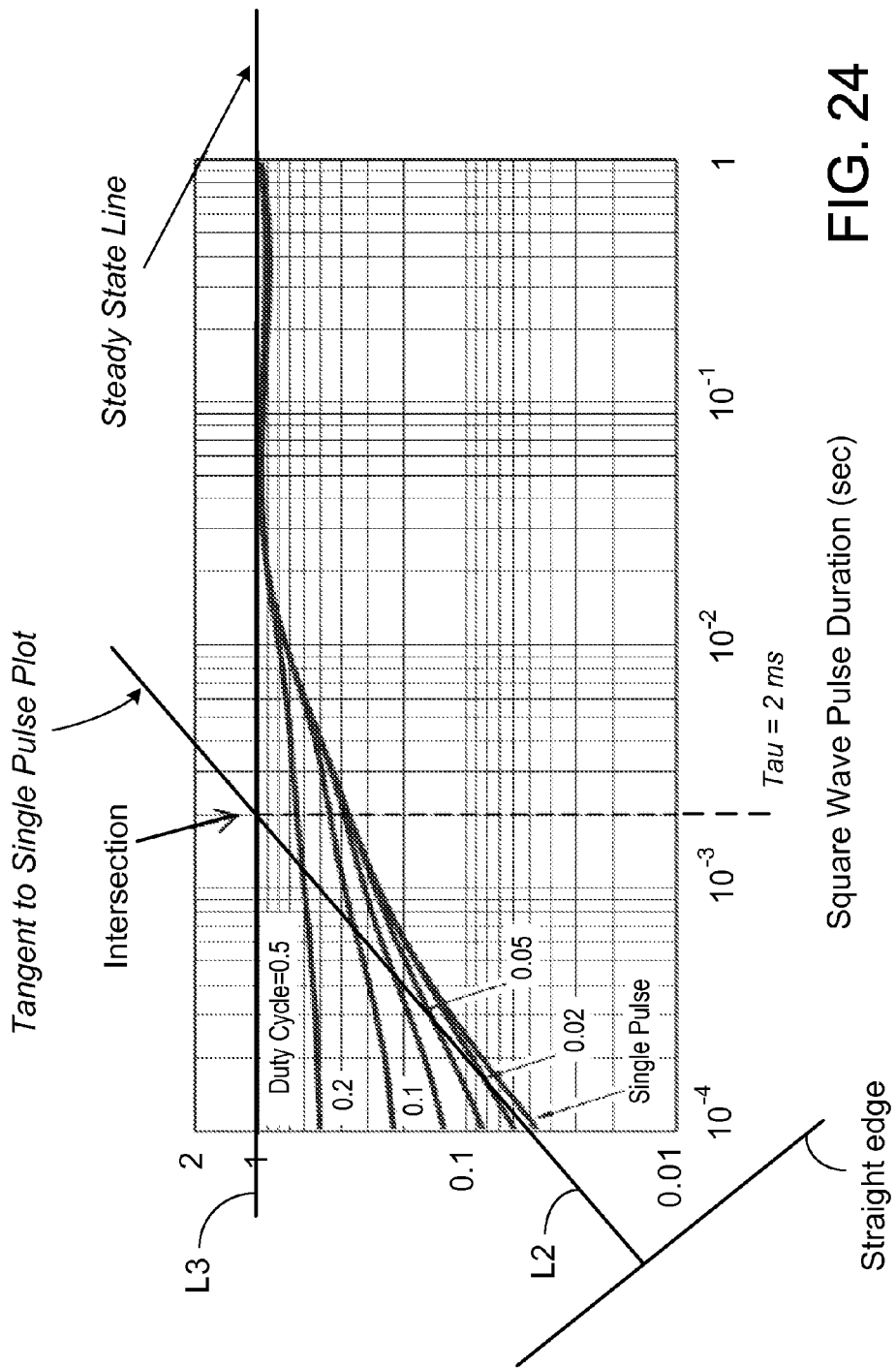

Since all linear curves starting at the origin (Y=aX) have a slope of 1 decade per decade when plotted on a logarithmic scale independent of the constant "a" in the equation, a line having a slope of 1 decade per decade may be drawn tangent to the single pulse curve. First, a line, L1, having a slope of 1 decade per decade passing through the X & Y axis intercept may be drawn as shown in FIG. 23. Verify that the line crosses points (x, y) where x and y are equal decades from the graph's origin. As shown in FIG. 23, line L1 passes through the coordinates ($10^{-4}$, 0.01) and ($10^{-3}$, 0.1). Next, a line, L2, parallel to the first line, L1, may be drawn tangent to the single pulse curve, e.g. by moving the right angle ruler or triangle along a straight edge until it contacts the graph's single pulse plot as a tangent to that plot, as shown in FIG. 24. Next, a line, L3, tangent to the steady state portion of the curve may be drawn. The intersection of the steady state line, L3, with the single pulse tangent line, L2 occurs at the 2 ms point as shown in FIG. 24. This value will be used for the time constant of the pole in the junction-to-case time constant (Tau=2 ms). Of course, the values input to the filter (TauJC: FIG. 17) will naturally depend upon the scaling of the other parameters.

In order to protect the power device against large fast power surges, the zero should be chosen to accelerate the filter response. For example, the time constant of the zero may be set to a fraction 1/n, e.g. ⅛, of the time constant of its adjacent pole to enable the filter to respond to a step change in input power. In some examples, n can range from 5 to 10. For a zero having a time constant that is 1/n times the time constant of its adjacent pole, the filter will respond immediately with an output magnitude that is 1/n times the input step. In other words, the designer may set a maximum allowable instantaneous product (power*RthJC) by setting the ratio of this product to the shutdown threshold. For example, the zero may be set to ⅛th of the pole time constant (⅛*Tau=2 ms/8=0.25 ms), setting an absolute maximum power dissipation of 480 Watts for a power device having a thermal resistance of 1 degree C./Watt and a shutdown threshold (the HI threshold of FIG. 17) of 60 degrees C., insuring a fast filter response to large power surges to reduce localized heating.

Figure 25:
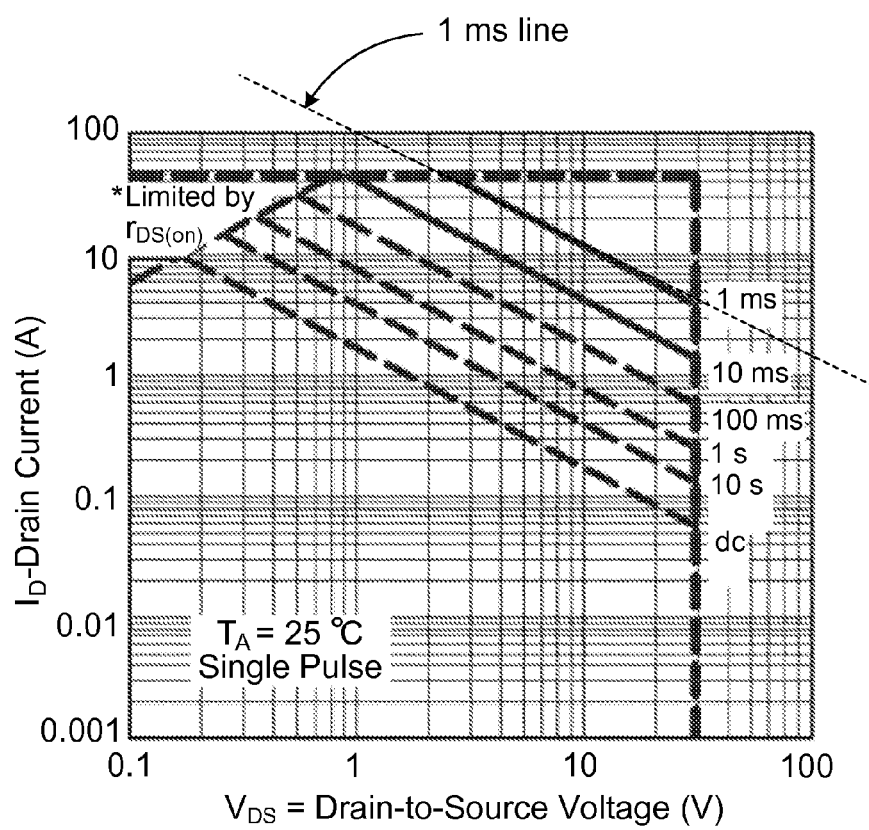
FIG. 25 is an example current-voltage plot used to determine filter parameters.

Alternatively, the manufacturer's SOA graph may be used instead where the transient thermal impedance graph is not available as shown in the following example for TauJC. Referring to FIG. 25, the value of TauJC for a single pole response approximation may be derived using an SOA graph. A typical SOA graph, such as shown in FIG. 25, may have constant power lines with negative unity slope (−1 decade/decade), on the log graph. These lines correspond to 100° C. Junction temperature rise (unless otherwise stated) where each point is identified by a Vds voltage and an Id current. The object is to extract from this graph the design information needed to calculate the values of the time constants for the digital SOA pole and zero. For typical surface mount power devices the 1 ms line in the SOA graph may be used to derive TauJC. The selection of the 1 ms line represents a good compromise because the junction-to-case time constant of the pole will be in the range of 10 ms to sub millisecond for a surface mount power device. First, the power level of the 1 ms constant power line may be determined by drawing a line with negative unity slope (−1 decade per decade) along the 1 ms line. The intersection with the 45 A line is 2.4 V: constant power of 108 W. This is the power that, when applied for 1 millisecond, would cause a Junction temperature rise of 100° C. Given a one pole response, the characteristic equation for a 1 ms response (t=0.001 seconds) is 100° C.=108 W*$Rth_{JC}$° C./W*(1−$e^{-0.001/Tau}$)) where Tau is the time constant of the pole in seconds and $Rth_{JC}$ is the Junction-to-Case steady state thermal resistance which is provided by the FET manufacturer's datasheet. Given $Rth_{JC}$=2.5° C./W, Tau=−0.001/ln(1−100/(108*2.5))=0.002162 seconds. Tau=2.2 milliseconds. As discussed above, the time constant for the zero may be set (e.g. internally calculated) as a fraction of the time constant of the pole (e.g. as Tau/8=0.27 ms) to insure a fast response to power surges.

A number of implementations have been described. Nevertheless, it will be understood that various modifications may be made without departing from the spirit and scope of the disclosed implementations. For example, the characteristics of the zero in the response of the filter function, e.g. the functional blocks between the pre-filter or data acquisition stage and the control stage, may be implemented by adaptively adjusting the HI threshold of the control stage based upon the amplitude or rate of change of the Power signal, or both. In such an implementation, the HI threshold may be lowered in response to a Power signal exceeding a predefined threshold, or the rate at which the Power signal rises exceeds a predefined threshold, or as a function of the amplitude and rate of change of the Power signal. Additionally, in various implementations, transistors, FETs, or MOSFETs are described. In general, the concepts described in this document can be applied to any of these devices, and to other electronic switch devices as well, in order to maintain operation of the devices within an SOA. Both analog and digital control circuits can be employed to maintain an electronic switch within an SOA. The control circuits can maintain an electronic switch within an SOA by modeling a relative temperature rise over an ambient temperature; or the control circuits can maintain an electronic switch within an SOA by sensing an ambient temperature and factoring in the ambient temperature, so as to model an absolute junction temperature. Various implementations relate to controlling current (e.g., in light of a fixed voltage). However, voltage can also be controlled using the principles described in this document. On-time and off-time can also be controlled (e.g., in implementations in which both current and voltage may vary). And in some implementations, both current and voltage can be controlled.

Although the above examples sensed the voltage across and current through electronic components, the reader will appreciate that other means for determining the voltage or current stresses may be used. For example, the voltage stresses may be assumed for certain applications, or determined by measuring the load voltage and/or the input voltage, as well as other points in the circuit in other applications. Similarly, the current may be assumed or derived using alternative approaches, e.g. using a current mirrors, hall effect device, and other well known techniques depending upon the application. As an example, in some switching applications, a constant ON voltage may be assumed for the transistor and used with the sensed current to produce the instantaneous power signal.

Although the above examples employ analog and digital filter or network models to emulate the thermal characteristics of semiconductor components such as transistors (such as those extracted from corresponding datasheets), look-up tables or point-by-point data set representations of the transient thermal characteristics of the component may additionally be used. For example, using a power input the system may extract a time value from the data set.

Accordingly, other implementations are within the scope of the following claims.

What is claimed is:

1. A method of dynamically maintaining operation of a power transistor within a safe operating area, the method comprising:
    employing the power transistor to control delivery of electrical power from a power source to a load;
    detecting a differential signal and controlling operation of the power transistor to produce variations in resistance of the power transistor to offset the differential signal;
    sensing an instantaneous current through the power transistor and an instantaneous voltage across the power transistor;
    based on the instantaneous current and instantaneous voltage, determining a net accumulated thermal energy in the power transistor; and
    when the determined net accumulated thermal energy exceeds a threshold, reducing at least one of the instantaneous current or the instantaneous voltage to thereby prevent further accumulation of thermal energy in the power transistor.

2. The method of claim 1, wherein determining the net accumulated thermal energy comprises generating a signal representative of instantaneous power dissipated by the power transistor, and providing the generated signal to a capacitor and resistor network.

3. The method of claim 2, wherein determining the accumulated thermal energy further comprises measuring a voltage of the capacitor and resistor network.

4. A method of dynamically maintaining operation of a transistor within a safe operating area, the method comprising:
- employing the transistor to control delivery of electrical power from a power source to a load;
- detecting a differential signal and controlling operation of the transistor to produce variations in resistance of the transistor to offset the differential signal;
- sensing an instantaneous current through the transistor and an instantaneous voltage across the transistor;
- generating a representation of thermal energy being added to the transistor from the circuit based on the sensed instantaneous current and sensed instantaneous voltage;
- generating a representation of a thermal response of the transistor to the representation of thermal energy dissipated in the transistor; and
- when the representation of the thermal response of the transistor meets predetermined criteria, controlling at least one of the current through the transistor or the voltage across the transistor.

5. The method of claim 4, wherein the representation of thermal energy comprises a signal representative of instantaneous power dissipated in the transistor, and wherein generating a representation of a thermal response comprises providing the generated signal to a capacitor and resistor network.

6. The method of claim 5, wherein the representation of a thermal response comprises a voltage at a terminal of the capacitor and resistor network.

7. A method comprising:
- extracting thermal characteristics of a transistor;
- providing a system having characteristics based upon the derived thermal characteristics of the transistor;
- using the transistor in a circuit;
- detecting a differential signal and controlling operation of the transistor to produce variations in resistance of the transistor to offset the differential signal;
- determining a current carried by the transistor and a voltage across the transistor;
- stimulating the system using information produced from the determined current or voltage; and
- controlling operation of the transistor as a function of a response by the system to the stimulation.

8. The method of claim 7 wherein the stimulating further comprises using information produced from the determined current and voltage.

9. The method of claim 8 wherein the determining comprises sensing at least one voltage and at least one current in the circuit.

10. The method of claim 9 wherein the stimulating comprises feeding a current representative of the product of multiplying the determined voltage and sensed current.

11. The method of claim 7 wherein the system is a network comprising at least one resistor and at least one capacitor.

12. The method of claim 7 wherein the thermal characteristics comprise one or more time constants in a transient thermal impedance of the transistor and one or more thermal resistances between a power dissipating portion of the transistor and a package, heatsink, or environment in which the transistor is to be located during operation.

13. The method of claim 7 wherein using the transistor comprises controlling the delivery of power between a source and a significantly capacitive load.

14. The method of claim 7 wherein the response by the system represents a relative junction temperature.

15. The method of claim 7 further comprising sensing a temperature of the environment to which the transistor is coupled during operation and wherein the response by the system represents an absolute junction temperature.

16. A method comprising:
- providing transistor for use in a circuit;
- detecting a differential signal and controlling operation of the transistor to produce variations in resistance of the transistor to offset the differential signal;
- sensing the voltage and current stresses on the transistor during operation in the circuit;
- modeling instantaneous temperature conditions in the transistor; and
- controlling operation of the transistor as a function of the instantaneous temperature conditions.

17. The method of claim 16 wherein the temperature conditions comprise a rise in temperature in the transistor.

18. The method of claim 16 wherein the temperature conditions comprise a junction temperature in the transistor.

19. The method of claim 16 wherein modeling instantaneous temperature conditions comprises producing a power signal representative of instantaneous power dissipation in the transistor.

20. The method of claim 19 wherein modeling instantaneous temperature conditions further comprises producing an energy signal representing energy accumulating in the transistor.

21. The method of claim 20 wherein the energy signal further represents energy dissipating out of the transistor.

22. The method of claim 16 wherein the modeling comprises modeling thermal characteristics of the transistor and emulating a thermal response of the transistor to the voltage and current stresses.

23. A method comprising enclosing circuitry for carrying out the method of claim 22 together with the transistor in a single device package.

24. The method of claim 22 wherein modeling thermal characteristics of the transistor further comprises characterizing a thermal time constant of the transistor.

25. The method of claim 24 wherein the method is carried out using digital calculations.

26. The method of claim 24 wherein the method is carried out using analog circuitry.

27. The method of claim 22 wherein modeling thermal characteristics of the transistor further comprises characterizing a thermal impedance between a region of the transistor and a physical interface.

28. The method of claim 27 wherein the interface is a heat sink.

29. The method of claim 27 wherein the interface is a gaseous environment.

30. The method of claim 16 wherein the controlling further comprises limiting the current through the transistor.

31. The method of claim 30 wherein the controlling further comprises the current limit up or down to regulate the temperature of a region of the transistor.

32. The method of claim 31 wherein the region of the transistor is a semiconductor junction.

33. The method of claim 16 wherein the controlling comprises turning the transistor OFF for a period of OFF-time.

34. The method of claim 33 wherein the controlling further comprises limiting the current.

35. The method of claim 33 wherein the period of OFF-time comprises a first duration during a start-up mode and a second longer duration during a steady state mode.

36. The method of claim 33 wherein the period of OFF-time is adaptively controlled as a function of operating conditions.

37. The method of claim 16 wherein the controlling comprises turning the transistor ON for a period of time.

38. The method of claim 37 wherein the controlling further comprises limiting the current.

39. The method of claim 16 wherein the controlling comprises causing the transistor to intermittently operate beyond steady state safe operating conditions.

40. The method of claim 16 further comprising deriving thermal characteristics of the transistor.

41. A method of dynamically maintaining operation of a power transistor within a safe operating area (SOA), the method comprising:
sensing input signals including an instantaneous current through the power transistor and an instantaneous voltage across the power transistor;
generating a first signal based on the instantaneous current and instantaneous voltage sensing,
filtering the first signal to produce a second signal, the filtering having a response that includes the characteristics of at least one zero and at least one pole;
controlling at least one of the instantaneous current through the power transistor or the instantaneous voltage across the power transistor in response to the second signal from the filtering.

42. The method of claim 41 wherein the controlling further comprises:
reducing at least one of the instantaneous current through the power transistor or the instantaneous voltage across the power transistor in response to the second signal exceeding a high threshold.

43. The method of claim 42 wherein the reducing comprises turning the power transistor OFF.

44. The method of claim 42 further comprising adjusting the high threshold in response to the reducing.

45. The method of claim 44 wherein the high threshold is reduced after a predetermined number cycles of reducing.

46. The method of claim 42 wherein the controlling further comprises:
increasing at least one of the instantaneous current through the power transistor or the instantaneous voltage across the power transistor in response to the second signal falling below a low threshold.

47. The method of claim 46 wherein the increasing comprises turning the power transistor ON.

48. The method of claim 46 further comprising adjusting the low threshold in response to the reducing.

49. The method of claim 48 wherein the low threshold is reduced after a predetermined number cycles of reducing.

50. The method of claim 41 wherein the first signal is representative of instantaneous power dissipated in the power transistor.

51. The method of claim 50 wherein the generating comprises multiplying a value representing the sensed voltage and a value representing the sensed current to produce a product representative of the instantaneous power dissipated in the power transistor.

52. The method of claim 41 wherein generating further comprises increasing the first signal to a value greater than a value representative of instantaneous power dissipated in the power transistor.

53. The method of claim 41 wherein the filtering comprises feeding the first signal to a plurality of parallel filters, and accumulating the outputs of the plurality of filters to produce the second signal.

54. The method of claim 53 wherein the plurality of filters comprises a first filter having a response based upon junction-to-case thermal characteristics of the power transistor.

55. The method of claim 54 wherein the junction-to-case thermal characteristics comprise one or more time constants in a transient thermal impedance of the power transistor and one or more thermal resistances between a power dissipating portion of the transistor and a case of the power transistor.

56. The method of claim 55 wherein the plurality of filters comprise a second filter having a response based upon case-to-ambient thermal characteristics of the power transistor.

57. The method of claim 56 wherein the case-to-ambient thermal characteristics comprise one or more time constants in a transient thermal impedance of the power transistor case and one or more thermal resistances between the power transistor case and a heatsink or environment in which the transistor is to be located during operation.

58. The method of claim 41 wherein the filtering comprises using a digital filter.

59. The method of claim 58 wherein at least one of the sensing, generating, and filtering further comprises converting an analog signal to a digital signal.

60. The method of claim 59 further comprising:
programming the filter with at least one parameter for adjusting the filter response.

61. The method of claim 60 wherein the programming comprises sensing a signal in a circuit.

62. The method of claim 60 wherein the programming is hardwired in the filter.

63. The method of claim 41 wherein the filtering comprises using an analog filter.

64. The method of claim 63 wherein the first signal is a current and the filtering comprises feeding the first signal to a capacitor and resistor network.

65. The method of claim 64 wherein the second signal comprises a voltage from the capacitor and resistor network.

66. The method of claim 41 further comprising:
providing an SOA circuit to perform the generating and filtering.

67. The method of claim 66 wherein the SOA circuit further performs the controlling.

68. The method of claim 67 wherein the SOA circuit is provided on a single die.

69. The method of claim 66 further comprising providing the SOA circuit and the power transistor in a unitary package.

70. The method of claim 67 wherein the unitary package is a chip scale system in a package.

71. The method of claim 41 wherein the controlling comprises turning the power transistor OFF for a period of OFF-time.

72. The method of claim 71 wherein the reducing further comprises limiting the current.

73. The method of claim 71 wherein the period of OFF-time comprises a first duration during a start-up mode and a second longer duration during a steady state mode.

74. The method of claim 71 wherein the period of OFF-time is adaptively controlled as a function of operating conditions.

75. The method of claim 41 wherein the controlling comprises turning the power transistor ON for a period of time.

76. The method of claim 75 wherein the controlling further comprises limiting the current.

77. The method of claim 41 wherein the controlling comprises causing the power transistor to intermittently operate beyond steady state safe operating conditions.

78. The method of claim 41 further comprising detecting a differential signal and controlling operation of the power transistor to produce variations in resistance of the power transistor to offset the differential signal.

79. The method of claim 41 further comprising:
multiplying at least one of the sensed input signals by a scaling factor.

80. The method of claim 79 further comprising:
receiving a scaling input signal to determine the scaling factor.

81. The method of claim 79 further comprising providing an SOA circuit to perform the multiplying, generating, and filtering.

82. The method of claim 79 further comprising providing an SOA circuit to perform the multiplying, generating, filtering and controlling.

83. The method of claim 82 wherein the SOA circuit is provided on a single die.

84. The method of claim 83 further comprising:
employing the power transistor to control delivery of electrical power from a power source to a load; and
providing the SOA circuit and the power transistor in a unitary package.

85. The method of claim 41 wherein the pole and the zero each comprises a respective time constant and further comprising setting the time constant of the zero in the range of five to ten times smaller than the time constant of the pole.

86. The method of claim 41 further comprising employing the power transistor to control delivery of electrical power from a power source to a load.

* * * * *

UNITED STATES PATENT AND TRADEMARK OFFICE
CERTIFICATE OF CORRECTION

| | | |
|---|---|---|
| PATENT NO. | : 8,299,767 B1 | Page 1 of 1 |
| APPLICATION NO. | : 12/776634 | |
| DATED | : October 30, 2012 | |
| INVENTOR(S) | : Claudio Tuozzolo et al. | |

It is certified that error appears in the above-identified patent and that said Letters Patent is hereby corrected as shown below:

Drawings, FIG. 7E, page 8 of 25, line 2, delete "Desctructive" and insert -- Destructive --.

Col. 6, line 52, after "3" insert -- . --.

Col. 19, line 60, after "shown" delete "as".

Col. 23, line 41, delete "$(1-e^{-0.001/Tau}))$" and insert -- $(1-e^{-0.001/Tau})$ --.

Signed and Sealed this
Twelfth Day of February, 2013

Teresa Stanek Rea
*Acting Director of the United States Patent and Trademark Office*